United States Patent
Iwahashi et al.

(10) Patent No.: US 6,795,368 B2
(45) Date of Patent: Sep. 21, 2004

(54) SEMICONDUCTOR INTEGRATED CIRCUIT DEVICE

(75) Inventors: Satoshi Iwahashi, Ome (JP); Shigeru Nakahara, Musashimurayama (JP); Takeshi Suzuki, Tachikawa (JP); Keiichi Higeta, Hamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/734,249

(22) Filed: Dec. 15, 2003

(65) Prior Publication Data

US 2004/0125683 A1 Jul. 1, 2004

Related U.S. Application Data

(62) Division of application No. 10/339,339, filed on Jan. 10, 2003, now Pat. No. 6,707,751.

(30) Foreign Application Priority Data

Jan. 29, 2002 (JP) ........................................ 2002-020222

(51) Int. Cl.⁷ ................................................. G11C 7/00
(52) U.S. Cl. .............. 365/230.05; 365/154; 365/230.08
(58) Field of Search ........................ 365/230.05, 230.08, 365/154

(56) References Cited

U.S. PATENT DOCUMENTS

| | | | |
|---|---|---|---|
| 4,509,147 A | 4/1985 | Tanimura et al. | |
| 5,483,489 A | 1/1996 | McClure | |
| 5,559,747 A | 9/1996 | Kasamizugami et al. | |
| 5,592,414 A | 1/1997 | Soneda et al. | |
| 5,963,486 A | 10/1999 | Yeung et al. | |
| 6,078,544 A | * 6/2000 | Park ........................ | 365/230.05 |
| 6,091,627 A | * 7/2000 | Luo et al. .................... | 365/154 |
| 6,101,579 A | * 8/2000 | Randolph et al. ........... | 711/131 |

FOREIGN PATENT DOCUMENTS

| | | |
|---|---|---|
| JP | 4-60991 | 6/1990 |
| JP | 4-205787 | 11/1990 |
| JP | 8-63975 | 8/1994 |
| JP | 8-129891 | 10/1994 |
| JP | 9-198870 | 1/1996 |
| JP | 9-245480 | 3/1996 |
| JP | 9-284100 | 4/1996 |

* cited by examiner

*Primary Examiner*—Vu A. Le
(74) *Attorney, Agent, or Firm*—Reed Smith LLP; Stanley P. Fisher, Esq.; Juan Carlos A. Marquez, Esq.

(57) ABSTRACT

The present invention provides a novel semiconductor integrated circuit device equipped with memory circuits, high-speed memories and large memory capacity memory circuits, which enables speeding up and facilitation of timing settings. The semiconductor integrated circuit device is provided with first amplifier circuits; which include first MOSFETs of first conductivity type, which have gates provided for a plurality of bit lines to which memory cells are respectively connected, and which are respectively maintained in an off state under precharge voltages supplied to the bit lines, as read circuits of the memory cells determined as to whether memory currents flow according to the operation of selecting word lines and memory information; and which are respectively brought to operating states in association with select signals for the bit lines, and also provided with a second amplifier circuit including; a plurality of second MOSFETs of second conductivity type, which have gates respectively supplied with a plurality of amplified signals of the first amplifier circuits and which are connected in parallel configurations; and which forms an amplified signal corresponding to the amplified signals of the first amplifier circuits.

26 Claims, 16 Drawing Sheets

OPERATING CONDITIONS: EDGE 2' < EDGE 3 < EDGE 2
FREQUENCY RESTRICTION: NIL

SEMICONDUCTOR INTEGRATED CIRCUIT DEVICE

This application is a Divisional of nonprovisioinal U.S. application Ser. No. 10/339,339 filed on Jan. 10, 2003, now U.S. Pat. No. 6,707,751. Priority is claimed based upon U.S. application Ser. No. 10/339,339 filed on Jan. 10, 2003, which claims the priority of Japanese Application No. 2002-020222 filed on Jan. 29, 2002.

BACKGROUND OF THE INVENTION

The present invention relates to a semiconductor integrated circuit-device, and to a technology effective for application to a large-scale integrated circuit provided with a memory circuit which performs a high-speed read operation.

One example of a static memory cell provided with a write port and a read port has been disclosed in Unexamined Patent Publication No. Hei 8(1996)-129891 (corresponding U.S. Pat. No. 5,592,414).

SUMMARY OF THE INVENTION

While the above-described memory cell having the read-only port is suited for a high-speed operation, a differential circuit is generally used as an amplifier circuit for sensing a read signal thereof. With micro-fabrication of each device according to semiconductor technology developments, a reduction in source or power supply voltage has been put forward. However, an improvement in offset voltage of a differential sense amplifier is not capable of coping with the reduction in the power supply voltage. It is expected that it will be advantageous to take a configuration for amplifying the read signal by means of an inverter circuit.

Since, however, an inverter-amplified circuit is not operated until the potential at each bit line exceeds a logical threshold value of an inverter, a circuit delay is large. Substituting a dynamic circuit for the inverter yields an improvement in circuit delay. However, the mere application of the dynamic circuit to an SRAM having a hierarchical bit line structure will cause a high possibility that a timing hazard of an internal circuit, i.e., a malfunction will be produced with respect to variations in manufacture. Or an excessive margin is needed to avoid the malfunction, thus causing a possibility that frequency performance of the circuit will be rate-controlled.

An object of the present invention is to provide a semiconductor integrated circuit device equipped with a memory circuit, which enables speeding up and facilitation of timing settings. Another object of the present invention is to provide a novel semiconductor integrated circuit device provided with a high-speed memory and a large storage capacity memory circuit. The above, other objects, and novel features of the present invention will become apparent from the description of the present specification and the accompanying drawings.

A summary of a typical one of the inventions disclosed in the present application will be described in brief as follows: There are provided first amplifier circuits; which include first MOSFETs of first conductivity type which have gates provided for a plurality of bit lines to which memory cells are respectively connected and which are respectively maintained in an off state under precharge voltages supplied to the bit lines, as read circuits of the memory cells determined as to whether memory currents flow according to the operation of selecting word lines and memory information; and which are respectively brought to operating states in association with select signals for the bit lines, and there is also provided a second amplifier circuit including; a plurality of second MOSFETs of second conductivity type, which have gates respectively supplied with a plurality of amplified signals of the first amplifier circuits and which are connected in parallel configurations; and which forms an amplified signal corresponding to the amplified signals of the first amplifier circuits.

DETAILED DESCRIPTION OF THE PREFERRED EMBODIMENTS

Figure 1:
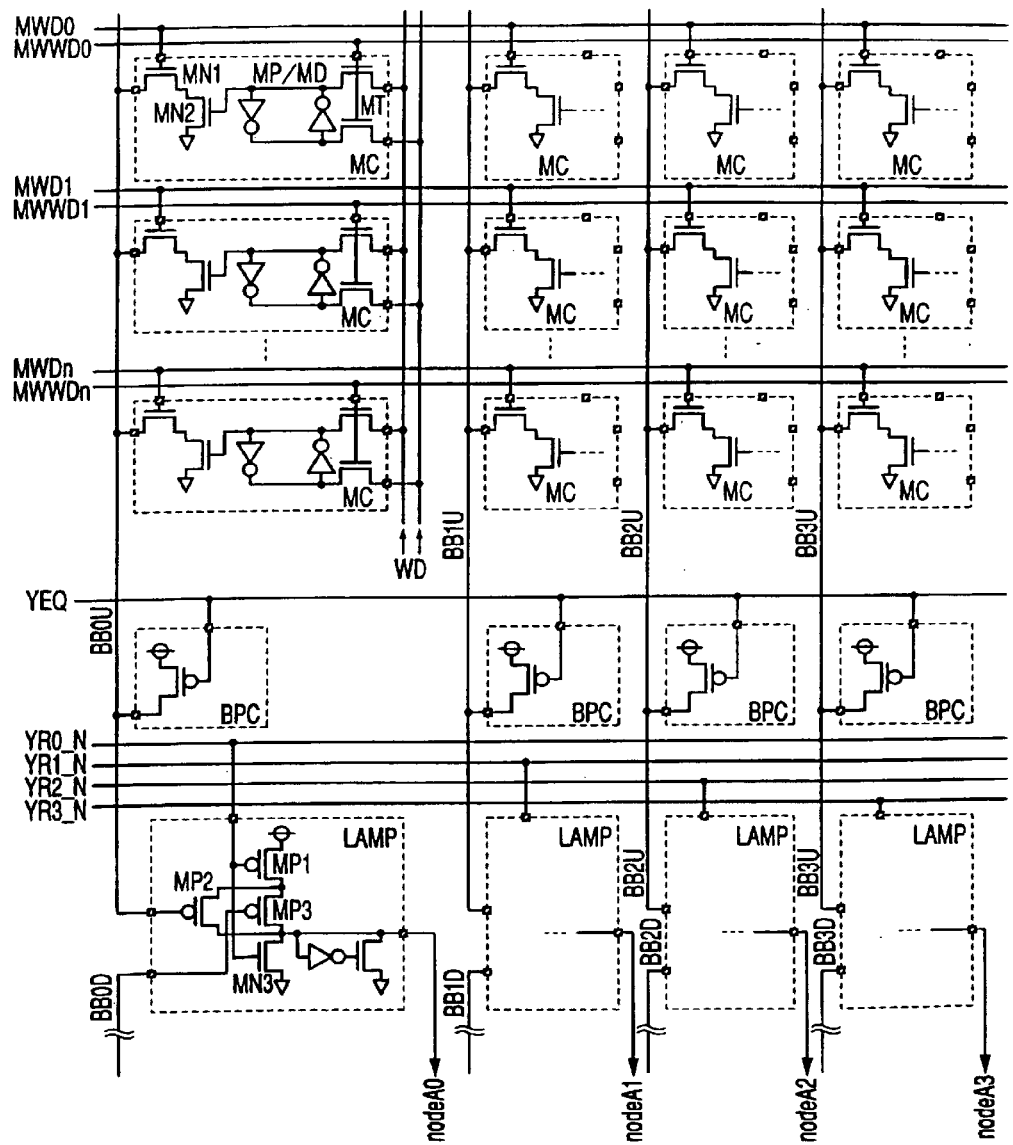
FIG. 1 is a circuit diagram showing one embodiment of part of a memory circuit mounted in a semiconductor integrated circuit device according to the present invention.
Figure 2:
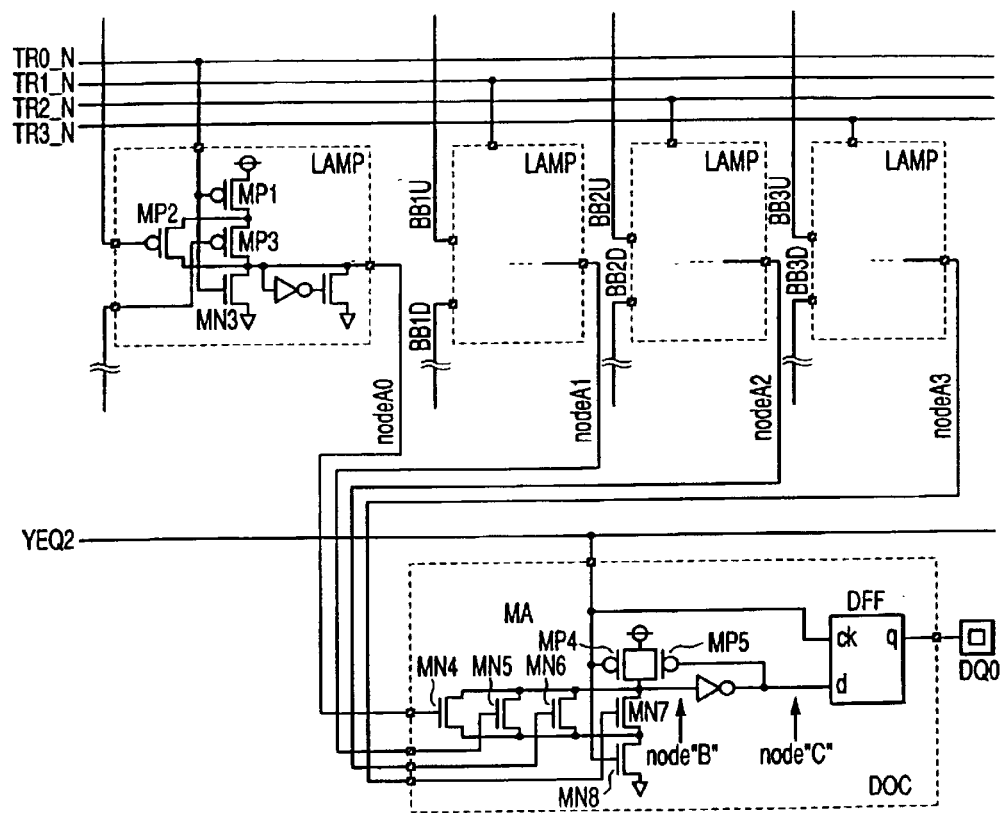
FIG. 2 is a circuit diagram illustrating one embodiment of the remaining part of the memory circuit mounted in the semiconductor integrated circuit device according to the present invention.

A circuit diagram of one embodiment of a memory circuit mounted in a semiconductor integrated circuit device according to the present invention is shown in FIGS. 1 and 2. A memory array unit and local amplifiers provided for bit lines are illustratively shown in FIG. 1. An output circuit including a main amplifier for amplifying signals outputted from the local amplifiers referred to above is illustratively shown in FIG. 2. The memory circuit according to the present embodiment constitutes a high-speed RAM macro mounted in a large-scale integrated circuit having a microcomputer function to be described later.

As memory cells MCs corresponding to a bit line at the left end, of a plurality of memory cells MCs disposed in a matrix form at points where a plurality of word lines and a plurality of bit lines intersect respectively, are illustratively shown as representatives, two-port memory cells having eight MOSFETs are used. Namely, as the memory cell MC at the upper left end of the same drawing is illustrated as typical, the memory cell MC has a two-port configuration wherein a latch circuit in which the inputs and outputs of two CMOS inverter circuits comprising a P channel type load MOSFETMP and an N channel type drive MOSFETMD are cross-connected, is used as a storage or memory unit, and write and read paths are respectively provided for the memory unit.

The write path comprises a pair of MOSFETMTs for address selection, which is provided between a pair of input/output nodes of the latch circuit, and complementary bit lines for writing. The read path comprises an N channel type MOSFETMN2 having a gate to which an information voltage at one storage or memory node of the latch circuit is applied, and a source supplied with a circuit's ground potential, and an address selecting MOSFETMN1 provided between the drain of the MOSFETMN2 and a read bit line BBU0. The gates of the pair of MOSFETMTs constituting the write path are connected to their corresponding write word line MWWD0, and the gate of the MOSFETMN1 constituting the read path is connected to its corresponding read word line MWWD0.

A bit line precharge circuit BPC comprising a P channel type MOSFE which receives a timing signal YEQ therein, is provided for the read bit line BB0U. A read signal on the bit line BB0U is amplified by its corresponding local amplifier (or sense amplifier) LAMP. The local amplifier LAMP is made up of an inverting amplifier circuit which also shares the use of a column selection circuit. Namely, the signal on the bit line BB0U is transferred to the gate of a P channel type amplifying MOSFETMP2, and a P channel type MOSFETMP1 and an N channel type MOSFETMN3 both switch-controlled by a column select signal YR0_N are provided for the drain and source of such a MOSFETMP2.

When the N channel type MOSFETMN3 is brought to an on state by the column select signal YR0_N, the N channel type MOSFETMN3 constitutes a load element of the MOSFETMP2 used as an amplifying element. The P channel type MOSFETMP1 is used as a switch used to supply an operating voltage. A low level latch circuit made up of an inverter circuit and an N channel type MOSFET is provided at the drain output of the amplifying MOSFETMP2.

In the present embodiment, although not restricted in particular, the bit lines are disposed up and down in the form divided for the local amplifiers LAMPs for the purpose of circuit's high integration. In the same drawing, the bit lines BB0U through BB3U of these, which are disposed on the upper side, are illustratively shown as representatives, whereas the bit lines BB0D through BB3D thereof disposed on the lower side are shown as merely parts with their memory cell units and precharge circuits being omitted therefrom. In order to cause the local amplifier LAMP to perform signal sensing of the vertical pair of bit lines BB0U and BB0D, the amplifying MOSFETMP2 and MOSFETMP3 are connected in a parallel configuration, and the bit lines BB0U and BB0D are connected to their gates.

Thus, when the local amplifier LAMP is shared between the bit line pair BB0U and BB0D divided up and down, the substantial length of each bit line can be reduced to half and the parasitic capacity or the like of each bit line can be also reduced to half. Therefore, this becomes beneficial to high-speed reading. In the present configuration, the corresponding word line of either one of the memory array on the upper side and the memory array on the lower side is selected.

As shown in FIG. 2, a plurality of pieces of signals corresponding to column selection circuits, which are outputted from the local amplifiers LAMPs, are brought together or complied and inputted to a main amplifier MA of an output circuit DOC. When any one of four bit lines is selected according to the four column select signals YR0_N through YR3_N as in the present embodiment, for example, output signals (nodes A0 through A3) of four local amplifiers LAMPs corresponding to it are transferred to the gates of N channel type amplifying MOSFETMN4 through MOSFETMN7. These amplifying MOSFETMN4 through MOSFETMN7 are connected in a parallel, configuration. A P channel type load MOSFETMP4 is provided at the drains of the amplifying MOSFETMN4 through MOSFETMN7, whereas an N channel type MOSFETMN8 used as a power switch for supplying a circuit's ground potential is provided at their sources.

A latch circuit for retaining a high level, which comprises an inverter circuit and a P channel type MOSFET, is provided at an output node B for the commonly-connected drains of the amplifying MOSFETMN4 through MOSFETMN7. A signal at an output node C of the inverter circuit constituting the latch circuit is transmitted to a D-type flip-flop circuit DFF. The P channel type MOSFETMP4 and N channel type MOSFETMN8 for controlling the operations of the D-type flip-flop circuit DFF and the main amplifier MA are respectively supplied with a timing signal YEQ2. An output signal is transmitted from an output q of the flip-flop circuit DFF to a data terminal DQ0. If the RAM macro according to the present embodiment is capable of performing reading in units of 32 bits, for example, then the memory array unit, the local amplifier and output circuit are provided as 32 sets.

Figure 3:
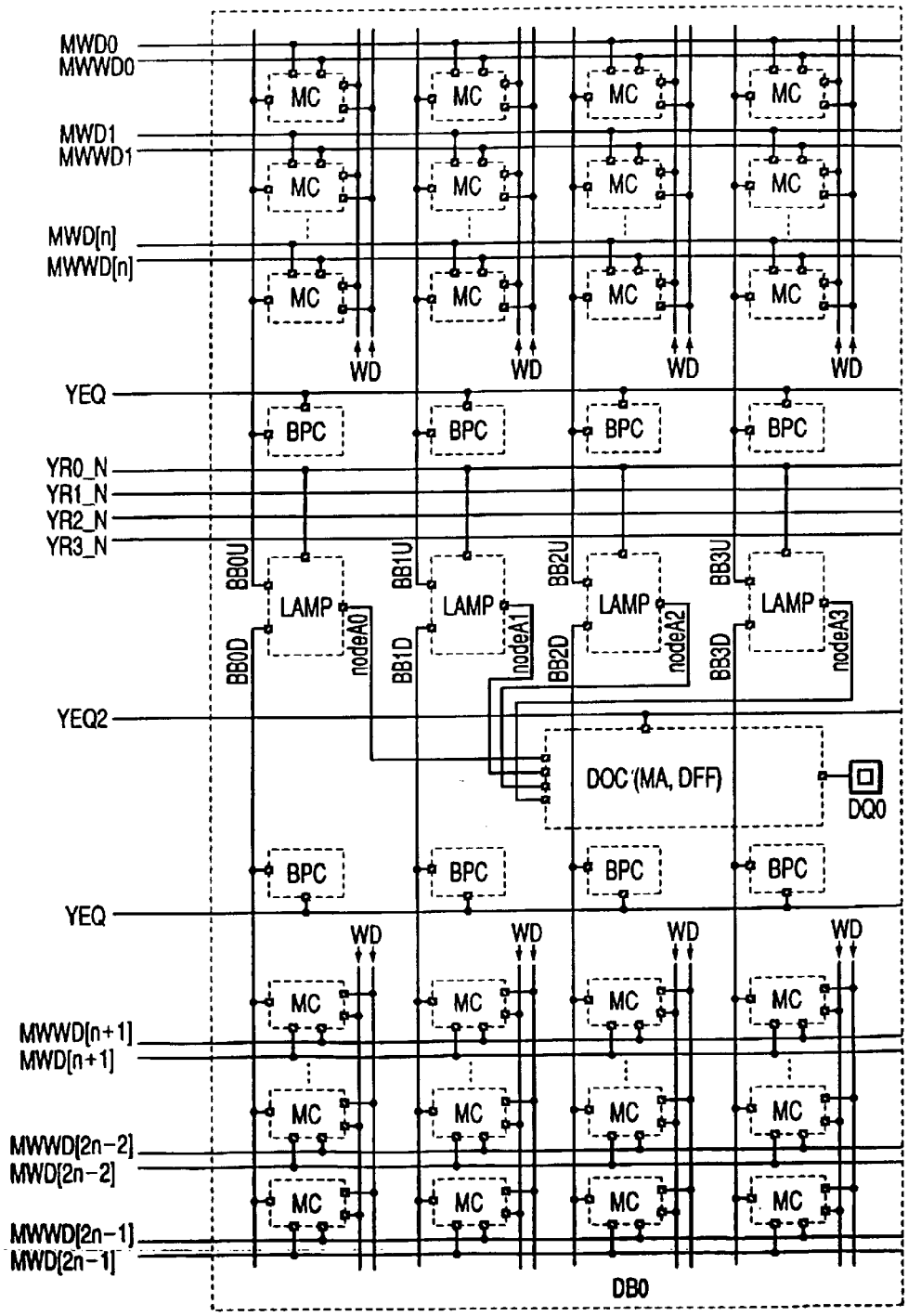
FIG. 3 is an overall circuit diagram showing a combination of FIGS. 1 and 2.

An overall circuit diagram showing a combination of FIGS. 1 and 2 is shown in FIG. 3. In the present embodiment, a memory unit (or memory block) corresponding to one data bit is shown. In one memory unit, one of four bit lines BB0 through BB3 is selected according to its corresponding one of the four column select signals YR0_N through YR3_N. In this case, the bit lines are divided and disposed in a distributed form up and down, and only a word line corresponding to any one of the bit lines is selected. Therefore, a one-bit column address is used to select the vertical word lines.

When data bits are made up of 32 bits, for example, the memory unit or memory block is provided thirty two. These 32 memory units or memory blocks are disposed side by side in a word line extending direction. Therefore, the word lines are respectively commonly connected to these memory units or memory blocks.

In the memory circuit employed in the present embodiment, each word line takes a pulse-driven system synchronized with the rising edge of a clock. As described above, the word lines are operated with respect to only one of the upper and lower arrays. Thus, one of the bit lines divided up and down is selected. Each local sense amplifier LAMP provided for a local bit line corresponding to a selected word line is made up of a block type domino circuit comprising a P channel type MOSFET. A clock of the P block type domino circuit is inputted with the negative-polarity signal YR0_N (where N: negative polarity (negative)) of the column select signals.

The respective signals are transferred to a subsequent-stage global sense amplifier (main amplifier MA) in association with respective outputs (nodes A) of the local sense amplifiers LAMP. The global sense amplifier MA comprises an N block type domino circuit made up of an N channel type MOSFET. A clock of the N block type domino circuit is supplied with a positive-polarity pulse YEQ2 of an input CK. A signal outputted from the global sense amplifier MA is transferred to a flip-flop circuit DFF for performing data latch, through a global bit line (node C).

Figure 4:
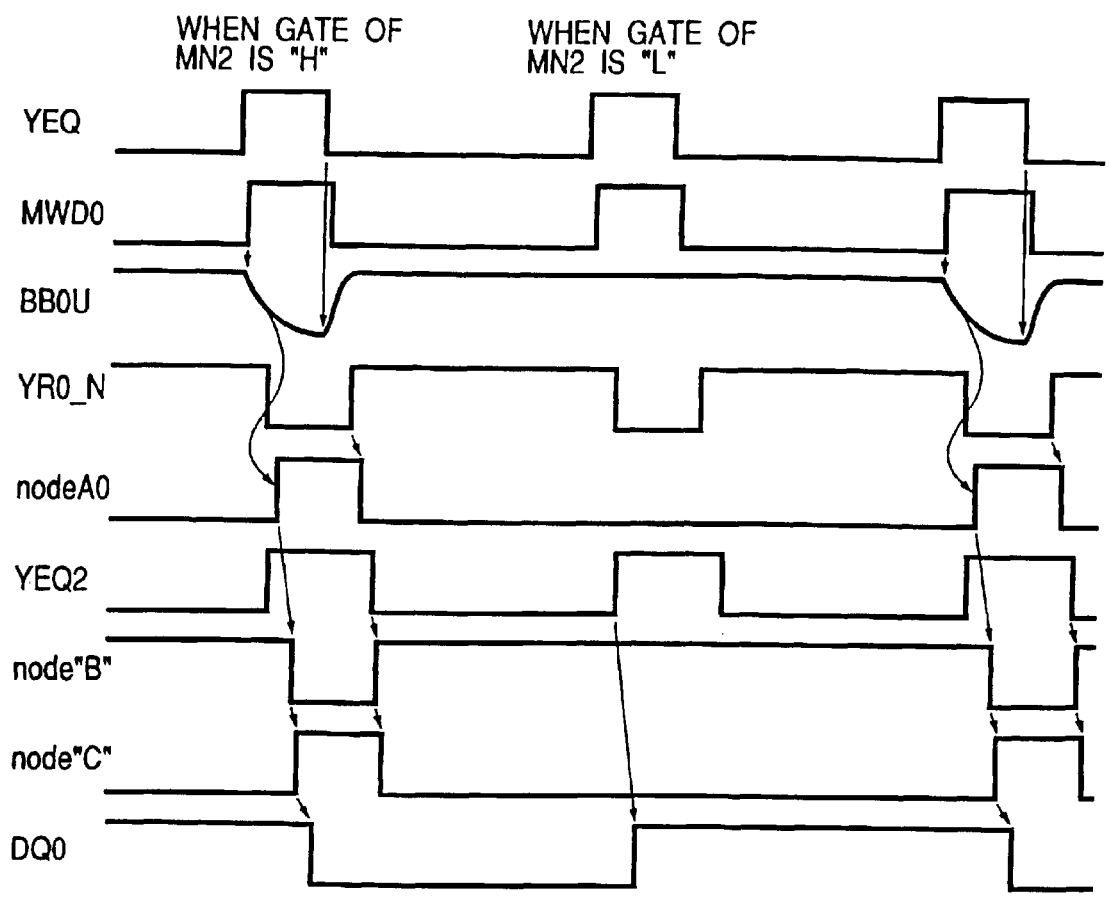
FIG. 4 is a timing chart for describing one example of operation of the memory circuit according to the present invention.

A timing chart for describing one example of operation of the memory circuit according to the present invention is shown in FIG. 4. A description herein is made assuming that a word line MWDO of read word lines MWDx (where x: numbers) is selected. The operation is based on the following premise. When bit lines BBxU/D are in non-operation, they are maintained at high levels by bit line precharge circuits (precharge signal YEQ=low level). Simultaneously when the read word line MWD0 is turned on (brought to a selected state), the precharge signal YWQ performs the operation of turning off each bit line (bringing it to a high level). Simultaneously when the read word line MWD0 is turned off, the precharge signal YEQ performs the operation of turning on each bit line (bringing it to a low level). Since word lines MWWDx are used for writing, they will be not mentioned in the present invention.

Since the word lines other than the selected word line MWD0 respectively remain at a low level (in a non-selected state), only the bit lines BBxU on the upper side of the memory array are capable of obtaining read signals from memory cells, and the bit lines BBxD on the lower side thereof are held at a high level (in a precharge state).

With the operation of selection of the word line MWD0, the following read signal is obtained at the bit lines BBxU. If the MOSFETMN2 are held in an on state in the memory cells according to memory information then the bit lines BBxU change from a high to a low levels with the states of turning on of the selected MOSFETMN1 by a high level of the word line MWD0. When such a read signal of low level is transmitted to the bit lines BBxU, the P channel type MOSFETMP2 of the local amplifiers are respectively brought to an on state. On the other hand, since the bit lines BBxD on the lower side remain at a precharge voltage, their corresponding P channel type MOSFETMP3 whose gates are supplied with it, remain in an off state.

If the MOSFETMN2 are held off according to the memory information in the memory cells, then memory current paths are not formed even if the MOSFETMN1 selected by the high level of the word line MWD0 are brought to the on state. Therefore, the bit lines BBxU are maintained at the high level. When such a read signal of high level is transmitted thereto, their corresponding P channel type MOSFETMP2 of the local amplifiers result in an off state. Accordingly, both MP2 and MP3 are held off.

When the column select signal YR0_N is now selected (high level→low level), the N channel type MOSFETMN3 of the corresponding local amplifier LAMP is brought to an off state and the P channel type MOSFETMP1 is brought to an on state. When the bit line BB0U changes from the high to low levels according to the read signal from the corresponding memory cell, the P channel type MOSFETMP2 is turned on as described above, so that its output node A changes from a low level to a high level. Since the P channel type MOSFETMP2 and the N channel type MOSFETMP3 are both held off when the bit line BB0U remains at a high level according to the read signal from the memory cell, the output node A is held low in level.

Since the N channel type MOSFETs (each corresponding to the MN3) of the local amplifiers LAMPs, which receive the non-selected column select signals YR1_N through YR3_N at their gates, are always held on, the outputs of the local amplifiers LAMPs are held low in level.

In the present embodiment, either one of the bit lines BBxU/D and column select signals YRx_N, which serve as inputs of the local amplifiers LAMPs, may start to operate firstly. Namely, the P channel type MOSFETMP1 are brought to an on state and the N channel type MOSFETMN3 are brought to an off state, according to the low level of the timing signal YEQ. Afterwards, the read signals based on the memory information from the memory cells may be transmitted through the bit lines BBxD/U. Alternatively, the read signals are transmitted to the bit lines BBxU/D according to selecting operations of the word lines MWDx, and the on state/off state of the P channel type MOSFETMP2/MP3 have been determined. Thereafter, the P channel type MOSFETMP1 may be held on and the N channel type MOSFETMN3 may be held off. As an alternative to it, they may be simultaneous.

In the main amplifier provided in the output circuit of the following stage, the N channel type MOSFETMN5 through MOSFETMN7 corresponding to non-select bit lines BB1 through BB3, of the N channel type MOSFETMN4 through MOSFETMN7 respectively maintain gate potentials held in an off state because the signals outputted from the local amplifiers LAMPs corresponding thereto are low in level.

Next, when an activation signal YEQ2 changes from a low level to a high level, the P channel MOSFETMP4 is brought to an off state and the N channel type MOSFETMN8 is brought to an on state. When the signal read onto the bit line BB0U changes from the high level to the low level as described above, the output signal of the local amplifier LAMP, i.e., the potential at the gate of the N channel type MOSFETMN4 of the main amplifier MA changes from a low to a high levels. Thus, the MOSFETMN4 and MOSFETMN8 change the output node B from the high to low levels to thereby bring the global bit line (node C) to a low level through the inverter circuit.

Since the gate potential of the N channel type MOSFETMN4 remains low in level when the bit line BB0U is keep high in level in reverse, the node B remains high in level and the node C remains low in level. Since the node B is brought to a floating state at this time, the latch circuit comprising the inverter circuit and the P channel type MOSFETMP5 maintains the node B at the high level. According to the above-described operation, a signal at the node C corresponding to the global bit line is taken or fetched in the flip-flop circuit DFF for performing the data latch, so that the signal at the data terminal DQ0 of the memory circuit SRAM is determined.

In the present embodiment, either one of the change in the signal at the node B and the activation signal YEQ2, which serve as inputs of the main amplifier MA, may start to operate firstly. Namely, the N channel type MOSFETMN8 of the main amplifier MA is brought to an on state and the P channel type MOSFETMP4 is brought to an off state, according to the high level of the timing signal YEQ2. Afterwards, the output signal (node B) of each local amplifier LAMP may be changed. Alternatively, the output signals of the local amplifiers LAMPs are transmitted and thereby the on state/off state of any one of the N channel type MOSFETMN4 through MOSFETMN7 has been determined. Thereafter, the N channel type MOSFETMN8 may be held on and the P channel type MOSFETMP4 may be held off. As an alternative to it, they may be simultaneous.

Figure 5:
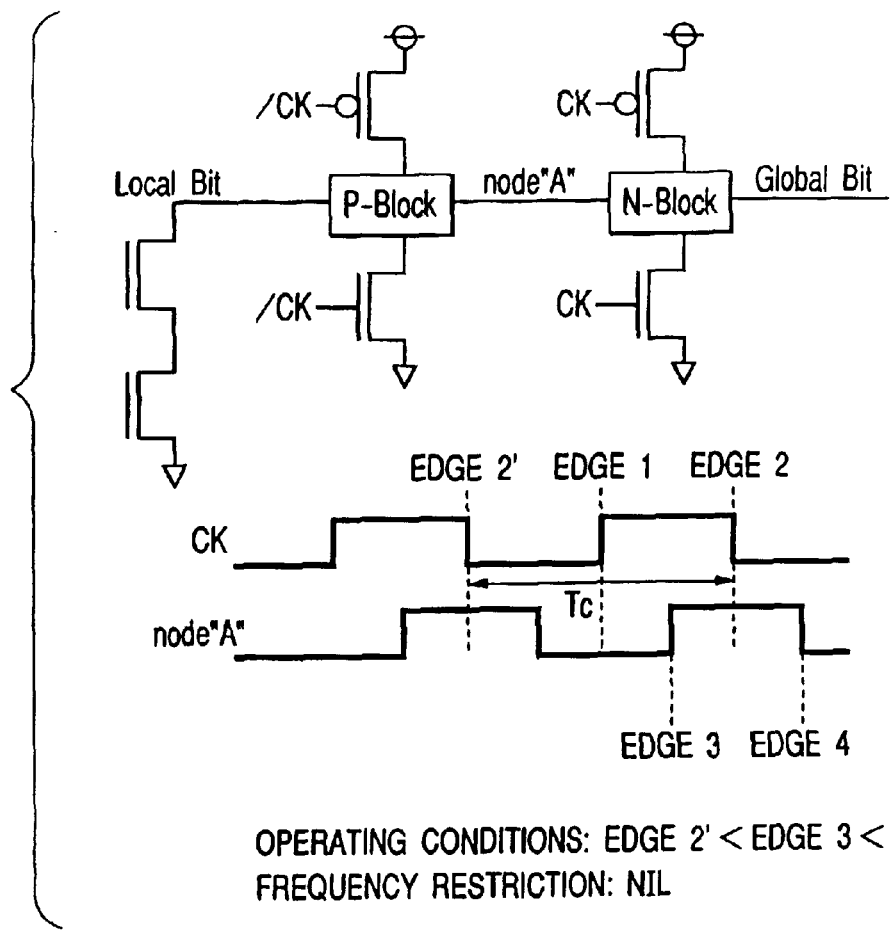
FIG. 5 is an equivalent circuit diagram showing a read path employed in the memory circuit according to the embodiment shown in FIG. 3.

An equivalent circuit diagram of a read path employed in the memory circuit of the embodiment is shown in FIG. 5. A read current path of a memory cell comprising two series-connected MOSFETs is connected to a local bit line and enters a logic block (P-Block) made up of P channel type MOSFETs constituting each local amplifier LAMP. Such a logic block is supplied with a source or power supply voltage through the corresponding P channel type MOSFET switch-controlled by a clock pulse /CK and supplied with a circuit's ground potential through the corresponding N channel type MOSFET switch-controlled by the clock pulse /CK.

An output node A of the logic block (P-Block) is inputted to a logic block (N-Block) made up of N channel type MOSFETs constituting a main amplifier MA. Such a logic block is supplied with the power supply voltage through the corresponding P channel type MOSFET switch-controlled by a clock pulse CK held in an antiphase relation with the local amplifier LAMP and supplied with the circuit's ground potential through the corresponding N channel type MOSFET switch-controlled by the clock pulse CK.

Since the relationship of time between each of the clocks /CK and CK and each of their corresponding input signals may be either of times prior to and subsequent to that time in such a circuit configuration, edge 2'<edge 3<edge 2 may be satisfied as operating conditions for the node A and the clock pulse, and no frequency restriction is given.

Figure 18:
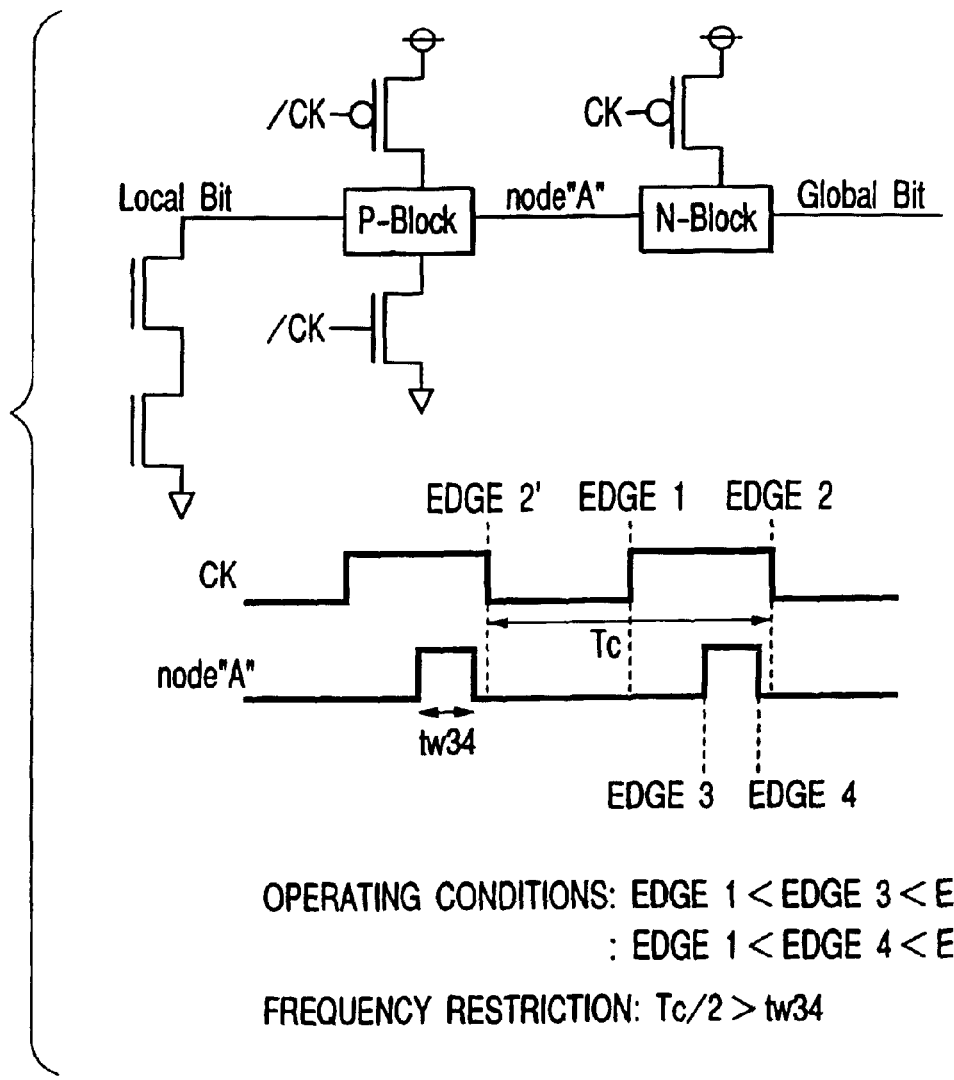
FIG. 18 is a configurational diagram illustrating one example of an amplifier circuit discussed in advance of the present invention.

Incidentally, such an amplifier circuit as shown in FIG. 18 has been discussed prior to the present invention as an example using a dynamic logic circuit. In the case of such one that a logic block (N-Block) made up of N channel type MOSFETs constituting a main amplifier MA is precharged by the corresponding P channel type MOSFET in response to a clock CK in FIG. 18, a node A must be set to a low level to avoid the flow of a dc current during a precharge period in which the clock CK is low in level. Accordingly, edge 1<edge 3<edge 2 and edge 1<edge 4<edge 2 are set as operating conditions, and Tc/2>tw34 is set as a frequency restriction.

Although not illustrated in the drawing, it has been also discussed that a local amplifier LAMP is used in common wherein the N channel type MOSFETMN3 of each of the local amplifiers LAMP referred to above is controlled by a signal YEQ_N, and the output node A is controlled by column signals YR0—3_N, and a signal at a node A is simply amplified by an inverter circuit. However, even such a configuration lacks speeding-up and reliability in terms of the following points.

Namely, timing control on the signal YEQ_N inputted to the gate of the N channel type MOSFETMN3 for fixing the node A to the low level, and column signals YR0—3_N becomes important. There is a possibility that it will occur on a racing basis. The N channel MOSFETMN3 must be fully increased in size to pull down the node A. As a result, a problem arises in that a pull-down N channel type MOSFETMN3, a P channel type MOSFETMP2 which accepts a bit line BB at its gate, and P channel type MOSFETMs of other local amplifiers LAMP are all connected to the node A, so that a load increases and thereby they cannot be operated at high speed.

Simply applying a dynamic circuit to a read system having a hierarchical bit-line structure as in the local bit lines and the global bit lines as described above yields a high possibility that a timing hazard of an internal circuit, i.e., a malfunction will be developed with respect to variations in manufacture. In order to avoid the malfunction, an excessive timing margin is needed. There is thus a possibility that circuit's frequency performance will be rate-controlled. In contrast to it, the present embodiment eliminates such a restriction and makes it possible to speed up the operation.

Figure 6:
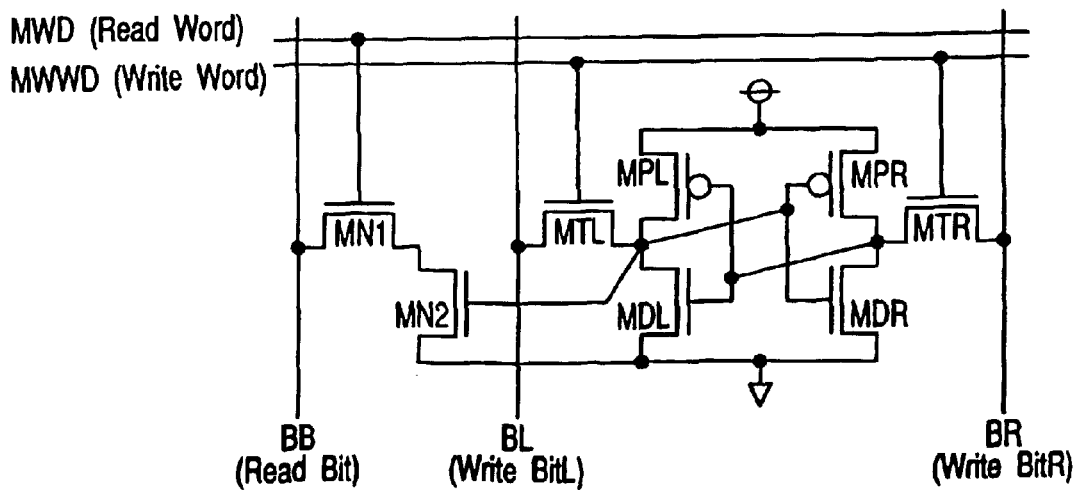
FIG. 6 is a circuit diagram illustrating one embodiment of a memory cell according to the present invention.

A circuit diagram of one embodiment of a memory cell according to the present invention is shown in FIG. 6. The memory cell according to the present embodiment comprises the 8 MOS memory cells as shown in FIG. 1. Namely, the inputs and outputs of two CMOS inverter circuits respectively comprising a P channel type MOSFETMPL and an N channel type MOSFETMDL, and a P channel type MOSFETMPR and an N channel type MOSFETMDR are cross-connected to provide a latch-configured connection. N channel type selection MOSFETMTL and MOSFETMTR whose gates are connected to a write word line MWWD, are provided between the pair of input/output nodes of the latch circuit and a pair of complementary write bit lines BL and BR, respectively.

A series circuit of N channel type MOSFETMN1 and MOSFETMN2 is provided as a read system circuit. The gate of the MOSFETMN2 is supplied with a hold voltage at one input/output node of the latch circuit, and the source thereof is supplied with a circuit's ground potential. The drain of the MOSFETMN1 is connected to a read bit line BB, and the gate thereof is connected to a read word line MWD.

In the present embodiment, the threshold voltages of the N channel type MOSFETMN1 and MOSFETMN2 constituting a read circuit are reduced as compared with those of the N channel type MOSFETMDL, MOSFETMDR, MOSFETMTL and MOSFETMTR and P channel type MOSFETMPL and MOSFETMPR constituting the latch with a view toward stabilizing an information retaining operation and speeding up a read operation.

For instance, the semiconductor integrated circuit device comprises three types of MOSFETs comprising a MOSFET having a high threshold voltage, which is formed as a gate insulating film constituting an input/output circuit and having a thickness thick for high withstanding or the like, a MOSFET having a middle threshold voltage, which has a thin gate insulating film constituting an internal circuit and is used for a slow signal path, and a MOSFET having a low threshold voltage, which is used for a high-speed signal path.

The N channel type MOSFETMDL, MOSFETMDR, MOSFETMTL and MOSFETMTR and P channel type MOSFETMPL and MOSFETMPR constituting the latch circuit are respectively formed so as to have the middle threshold voltage. On the other hand, the N channel type MOSFETMN1 and MOSFETMN2 constituting the read circuit are respectively set to the low threshold voltage used for the high-speed signal path.

In order to further speed up the read operation, the size (channel width) of the MOSFETMN1 connected to the bit line BB, of the series-connected MOSFETMN1 and MOSFETMN2 of the read circuit, is formed small, and the MOSFETMN2 thereof which receives the hold voltage at its gate, is set to a relatively large size (channel width). Allocating the sizes of the MOSFETMN1 and MOSFETMN2 to an occupied area assigned to the series circuit in the memory cell so that they are different from each other makes it possible to reduce parasitic capacitance of the drain of the MOSFETMN1 connected to the bit line and thereby reduce bit-line load capacitance. Increasing the size of the MOSFETMN2 enables obtaining of a relatively large memory current.

Figure 7:
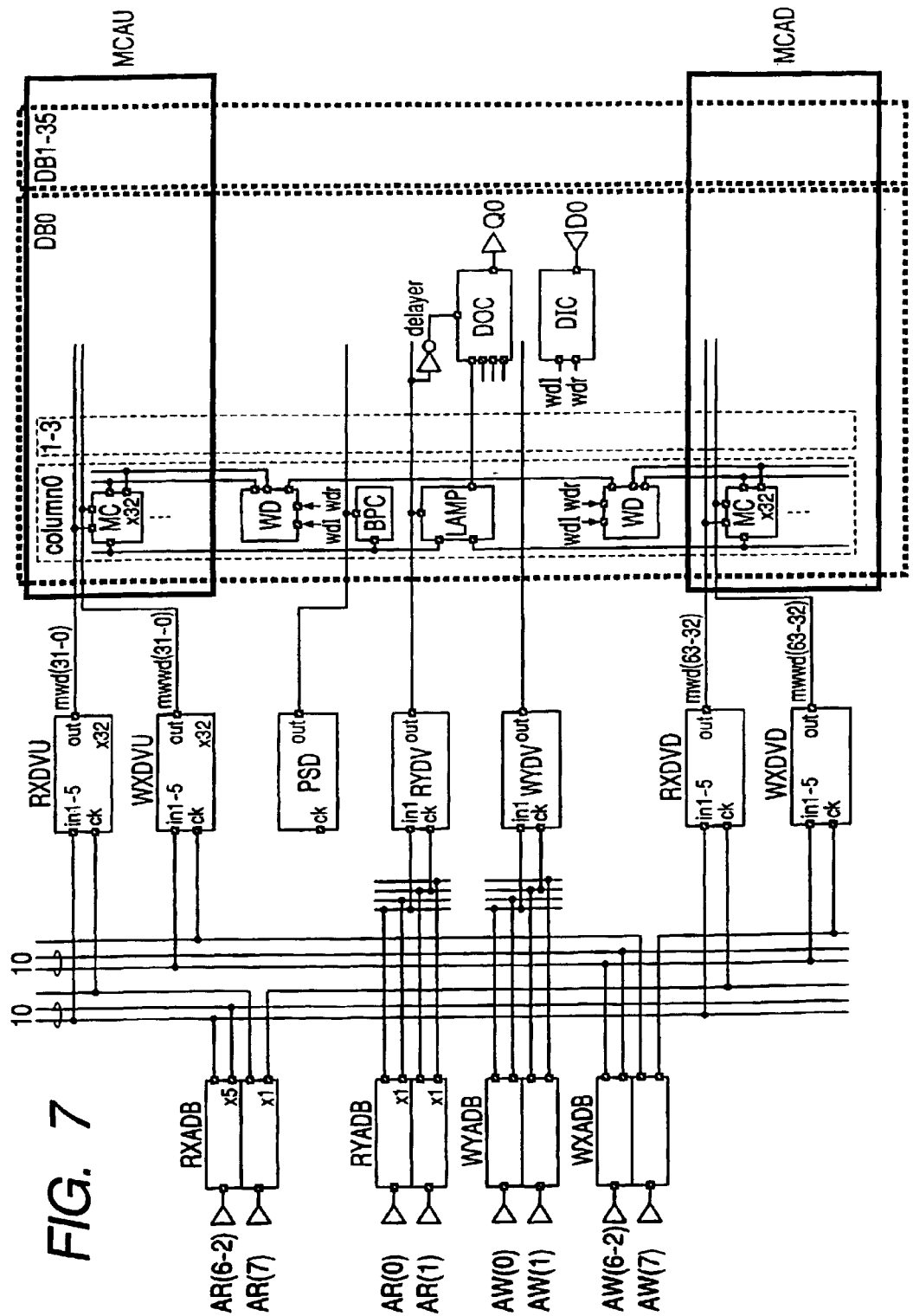
FIG. 7 is an overall block diagram depicting one embodiment of the memory circuit according to the present invention.

An overall block diagram of one embodiment of a memory circuit according to the present invention is shown in FIG. 7. A memory array is provided with memory units or memory blocks DB0 through DB31 corresponding to data bits 0 through 31 in word-line extending directions. The memory array is divided into memory cell arrays MCAU and MCAD of two (upper U and lower D) so as to interpose bit line precharge circuits BPC, local amplifiers LAMPs, write drivers WDVs, output circuits DOCs and input circuits DICs in extending central portions of bit lines.

The output circuit DOC corresponds to a data output terminal Q0, and the input circuit DIC corresponds to a data input terminal D0. Four local amplifiers LAMPs are assigned to one output circuit DOC of the above output circuits DOCs. The local amplifiers LAMPs are connected to read bit lines of the memory cell arrays MCAU and MCAD divided up and down. Four read bit lines are respectively assigned to the data output terminal Q0 and data input terminal D0, and column addresses are set like 0 through 3. 32 memory cells are respectively connected to the bit lines divided up and down. Output signals wdl and wdr of the input circuit DIC are respectively transferred to write drivers WDs provided in association with write bit line pairs divided up and down.

Read word lines MWD31 through 0 of an upper memory array are respectively selected by an upper X read decoder & driver RXDVU (x 32), and write word lines MWWD31 through 0 are respectively selected by an upper write decoder & driver WXDVU (x 32). Read word lines MWD63 through 32 of a lower memory array are respectively selected by a lower read decoder & driver RXDVD (x 32), and write word lines MWWD63 through 32 are respectively selected by a lower write decoder & driver WXDVD (x 32).

Read addresses AR(0) and AR(1) are supplied to a read Y decoder & driver RYDV through a read Y address buffer RYADB, where the column select signals YR0_N through YR3_N are generated. Similarly, write addresses AW(0) and AW(1) are supplied to a write Y decoder & driver WYDV through a write Y address buffer WYADB, where an activation signal for each write driver WD is formed.

Of read addresses AR(2) through AR(7), the address AR(7) corresponding to the most significant bit is used for a word line select signal of either the upper side or the lower side through the read Y address buffer RYADB. The addresses AR(6-2) corresponding to 5 bits of low orders (2) through (6) are supplied to the upper and lower decoders & drivers RXDVU/D through a read X address buffer RXADB to form 1/32 select signals. Similarly, of write addresses AW(2) through AW(7), the address AW(7) corresponding to the most significant bit is used for a word line select signal of either the upper side or the lower side through the write Y address buffer WYADB. The addresses AW(6-2) corresponding to 5 bits of low orders (2) through (6) are supplied to the upper and lower decoders & drivers WXDVU/D through a write X address buffer WXADB to form 1/32 select signals.

Thus, the read operation and the write operation are made independently of each other. In the respective memory units or memory blocks, one memory cell is selected from 32×2× 4. In the whole 32 memory units or memory blocks, 32 memory cells are selected. As a memory circuit, reading or writing of data in units of 32 bits can be performed independently respectively.

Figure 8:
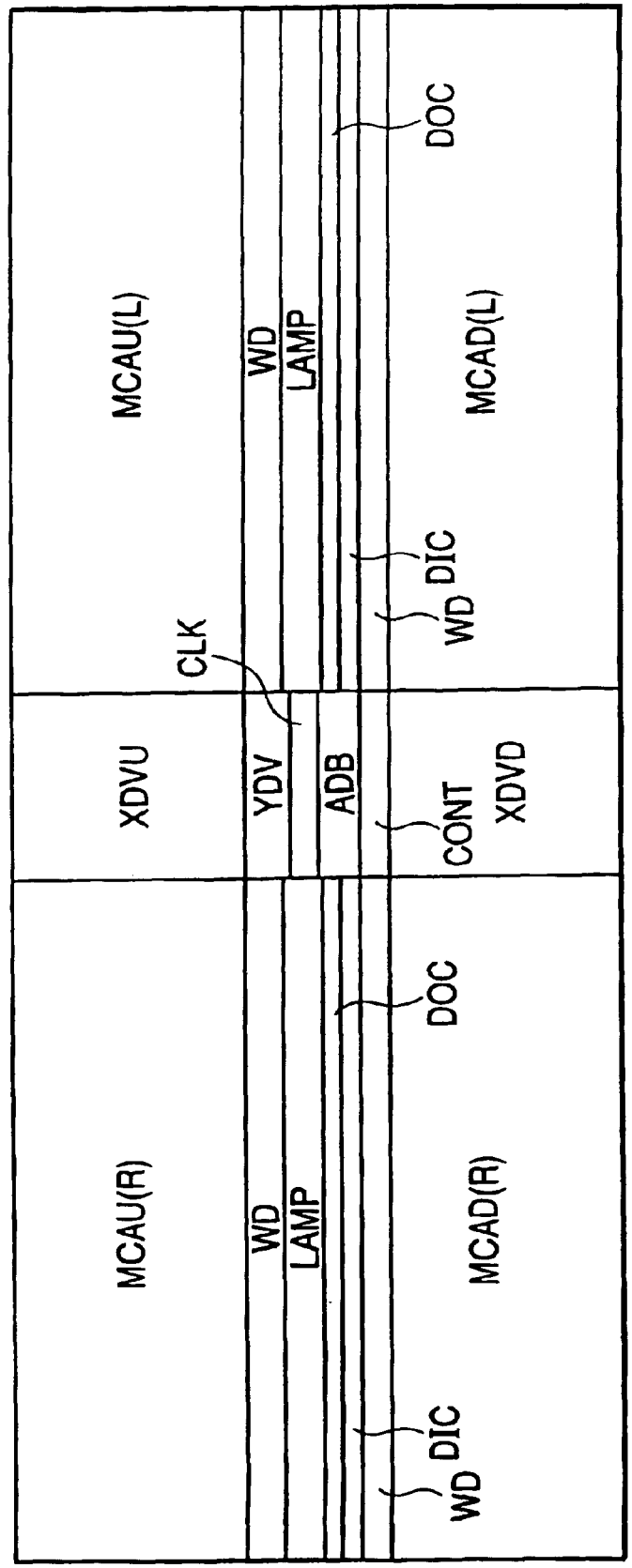
FIG. 8 is an overall layout diagram showing one embodiment of the memory circuit according to the present invention.

An overall layout diagram of one embodiment of the memory circuit according to the present invention is shown in FIG. 8. The present embodiment corresponds to the embodiment shown in FIG. 7. A memory array is divided into two in a word-line extending direction and divided into two even in a bit-line extending direction. Namely, the 32 memory units or memory blocks are divided 16 by 16 in a central portion of each word line as viewed in the word-line extending direction, and X decoders & drivers (XDVU= above RXDVU/D and WXDVU/D) are disposed in the central portion thereof. A local amplifier LAMP, a write driver WDV and output circuit DOC, and an input circuit DIC are provided in a central portion of each bit line as viewed in a bit-line extending direction. The precharge circuit BPC is also provided therein.

Owing to the placement of the X decoders & drivers in the intermediate portion of each word line as viewed in the word-line extending direction as described above, the length of each word line as viewed from the driver can be reduced to half, and the operation of selecting each word line can be speeded up. A column decoder & driver YDV, an address buffer ADB, a clock circuit CLK and a control circuit CONT are provided in a central portion of each memory block.

Figure 9:
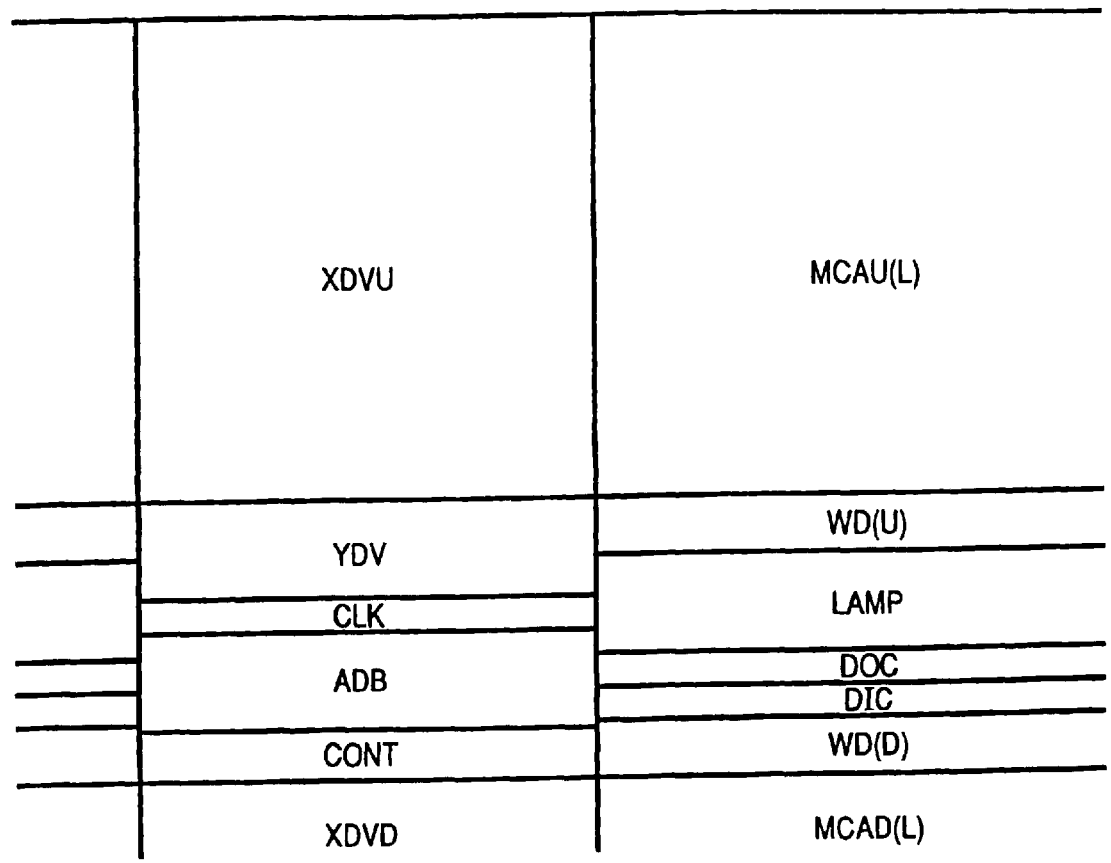
FIG. 9 is a layout diagram of one embodiment of a central portion of FIG. 8, which is shown in a developed form.

An enlarged layout diagram of the central portion of FIG. 8 is shown in FIG. 9. The X decoder & driver XDVU (RXDVU+WXDVU) related to it is illustratively shown in the same drawing with some of the memory array MCAU (L), local amplifier LAMP, output circuit DOC and input circuit DIC, and write drivers WD (U and D) being brought together. The column (Y) decoder & driver YDV, clock circuit CLK, address buffer ADB and control circuit CONT are provided in the above central portion.

Figure 10:
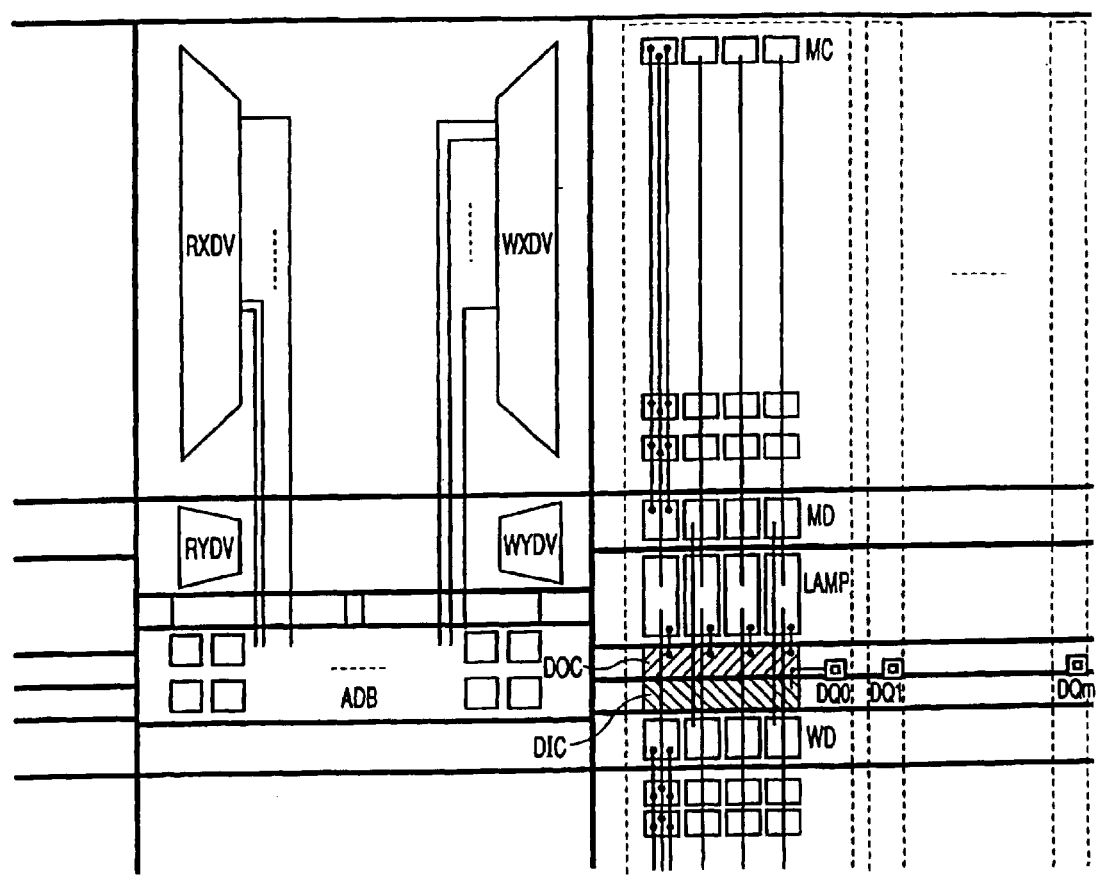
FIG. 10 is a layout diagram of one embodiment of the central portion of FIG. 8, which is illustrated in the developed form.

A layout diagram of one embodiment showing the central portion of FIG. 8 in a developed form is shown in FIG. 10. In the present embodiment, X decoders & drivers XDV are provided so as to be divided into a read RXDV and a write WXDV from side to side along arrangements of word lines. Address buffers are also provided so as to be divided into read and write ADBs in association with them. Similarly, column decoders & drivers YDV are also provided so as to be divided into a read RYDV and a write WYDV from side to side. However, these read and write decoders & drivers are respectively configured such that one select signal simultaneously selects the corresponding word line and the corresponding column select line of memory arrays divided into the right and left (16 bits by 16 bits).

Figure 11:
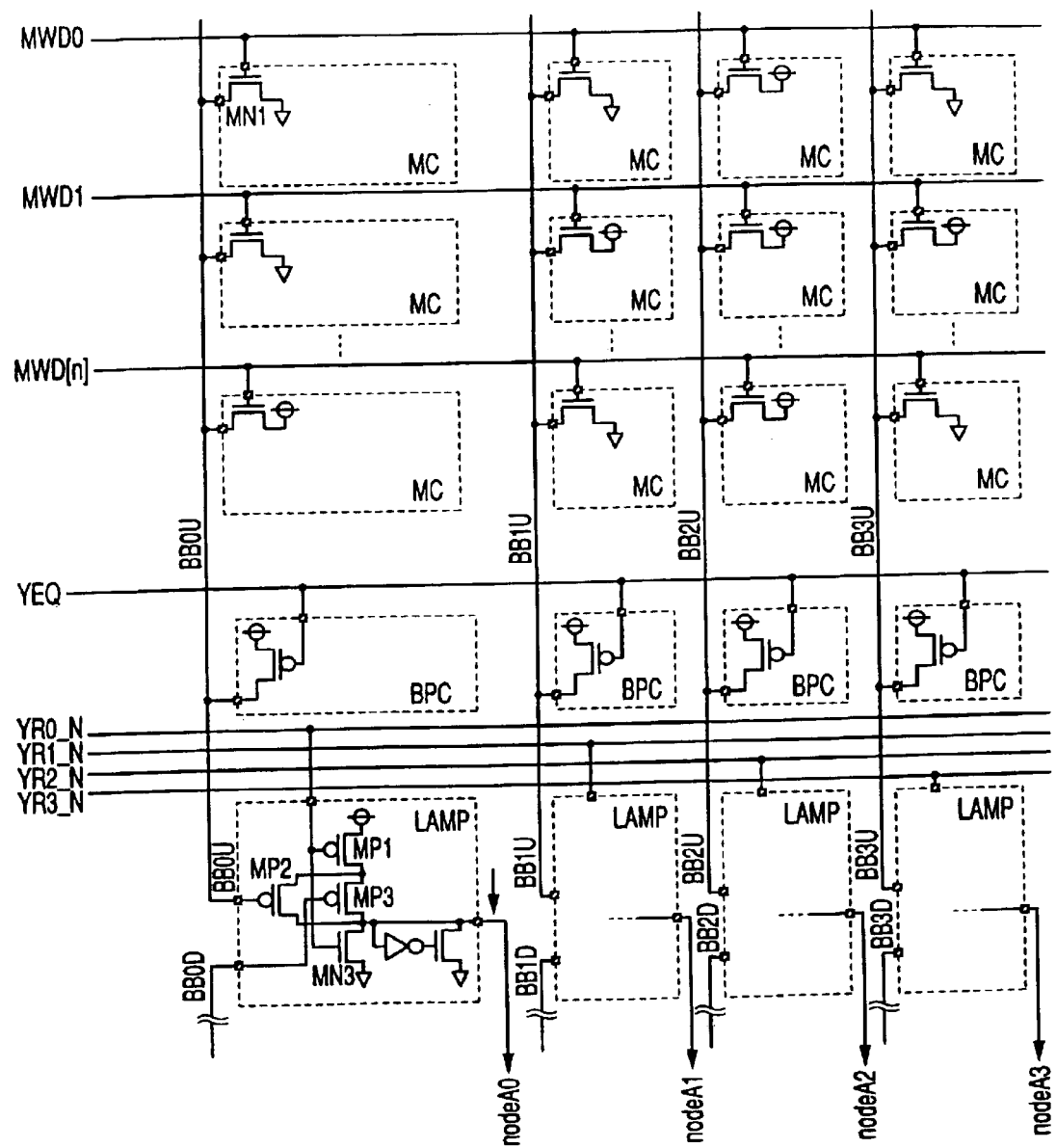
FIG. 11 is a circuit diagram showing another embodiment of a memory circuit mounted in a semiconductor integrated circuit device according to the present invention.

A circuit diagram showing another embodiment of a memory circuit mounted in a semiconductor integrated circuit device according to the present invention is shown in FIG. 11. A memory array unit and local amplifiers provided for bit lines are illustratively shown in the same drawing. Output signals of the local amplifiers are transferred to the output circuit including the main amplifier shown in FIG. 2. A memory circuit according to the present embodiment also constitutes a high-speed RAM macro mounted in a large-scale integrated circuit having a microcomputer function to be described later.

A plurality of memory cells MCs disposed in a matrix form at points where a plurality of word lines and a plurality of bit lines intersect respectively, comprise one N channel type MOSFETMN1 respectively. The MOSFETMN1 constitute a so-called mask ROM. The gates thereof are connected to their corresponding word lines MWD. One of the source and drain of each MOSFETMN1 is connected to a bit line BB. The source and drain thereof are connected to a circuit's ground potential or a source or power supply voltage in association with memory information.

Thus, the MOSFETMN1 constituting each memory cell takes two values or a binary form indicative of whether a memory current should be caused to flow in association with memory information in response to a select level of the word line MWD. The memory information may be set in a manufacturing process depending on either of whether the gate of the MOSFETMN1 is connected to its corresponding word line, or the drain thereof is connected to its corresponding bit line, or the threshold voltage of the MOSFETMN1 is formed high in response to a select level of each word line (on state/off state).

The present embodiment is similar in other configuration to the embodiment shown in FIG. 1 except for the above-described structure of each memory cell. Namely, bit line precharge circuits BPCs are provided for the bit lines. For example, a read signal for a bit line BB0U is amplified by its corresponding local amplifier (or sense amplifier) LAMP. The local amplifier LAMP is made up of an inverting amplifier circuit which also shares the use of a column selection circuit. The bit line BB0U is connected to the gate of a P channel type amplifying MOSFETMP2, and a P channel type MOSFETMP1 and an N channel type MOSFETMN3 both switch-controlled by a column select signal YR0_N are provided for the drain and source of such a MOSFETMP2. Owing to the use of such local amplifiers/main amplifier as described above according to the invention of the present application, such a mask ROM is also capable of performing a high-speed read operation.

Figure 12:
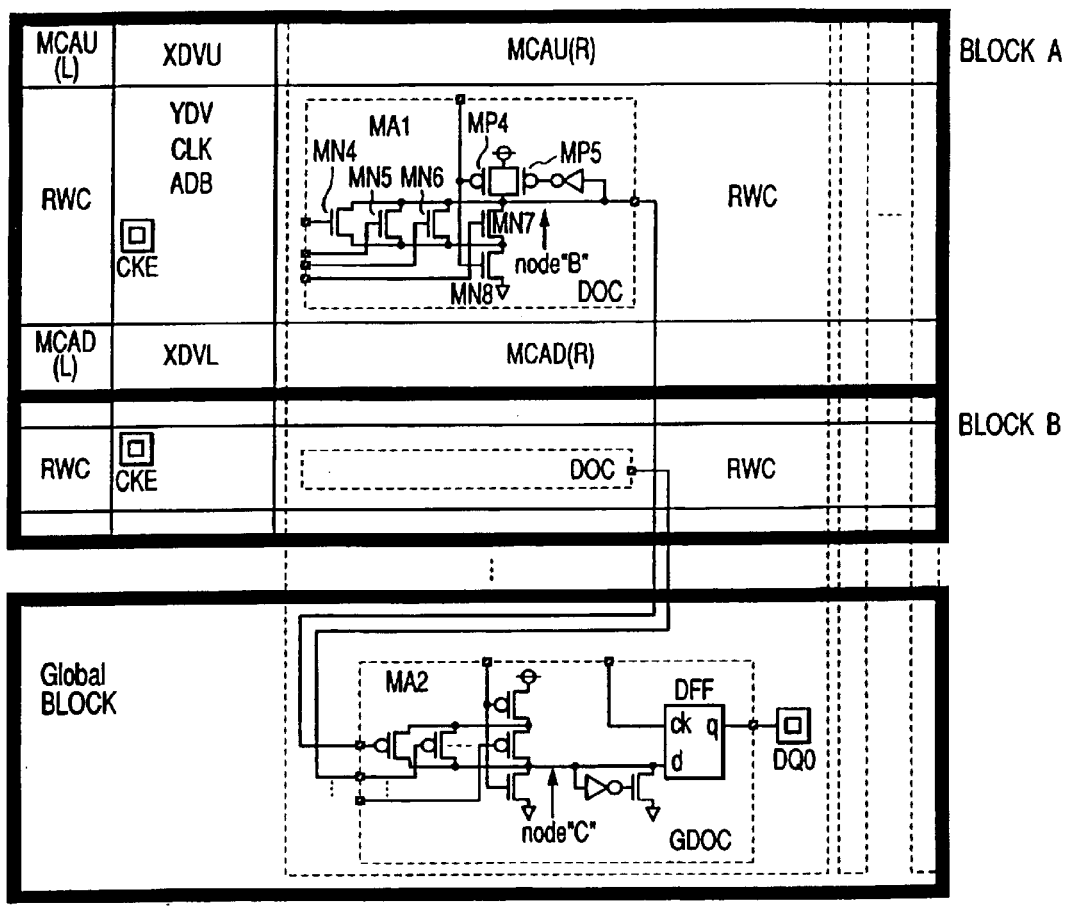
FIG. 12 is a configurational diagram illustrating a further embodiment of a memory circuit according to the present invention.

A configurational diagram illustrating a further embodiment of a memory circuit according to the present invention is shown in FIG. 12. The present embodiment is intended for expansion of memory capacity. Namely, a plurality of memory circuits like the above-described memory circuits BLOCKA and BLOCKB are vertically piled in a bit line direction with respect to a global output circuit GDOC provided with a flip-flop circuit DFF for performing data latch. Thus, the memory capacity can be increased in association with the number of blocks (BLOCKS).

In the present configuration, each of the illustratively shown memory blocks BLOCKA and BLOCKB is provided with a first main amplifier MA1 which receives an output signal of the local amplifier LAMP. A signal at its output node B is transferred to a second main amplifier MA2 similar to the local amplifier LAMP of the global output circuit GDOC through a global bit line and taken or fetched into the flip-flop circuit DFF for performing the data latch. The memory blocks BLOCKA and BLOCKB are respectively provided with clock enable terminals CKEs. Thus, their block selecting operations are performed. If a signal outputted from the first main amplifier MA1 is fixed to a high level in each non-selected memory block, then the second main amplifier MA2 amplifies a signal of each selected one.

In this configuration, a memory array can be expanded in the bit line direction. With an increase in the number of expansions, large memory capacity can be realized with respect to the memory circuit according to the embodiment shown in FIG. 1. In a memory circuit formed in a semiconductor integrated circuit device, a data output terminal (data input terminal) can be disposed at an end of the memory circuit brought into a macro cell form, whereby the input/output of data becomes easy.

Figure 13:
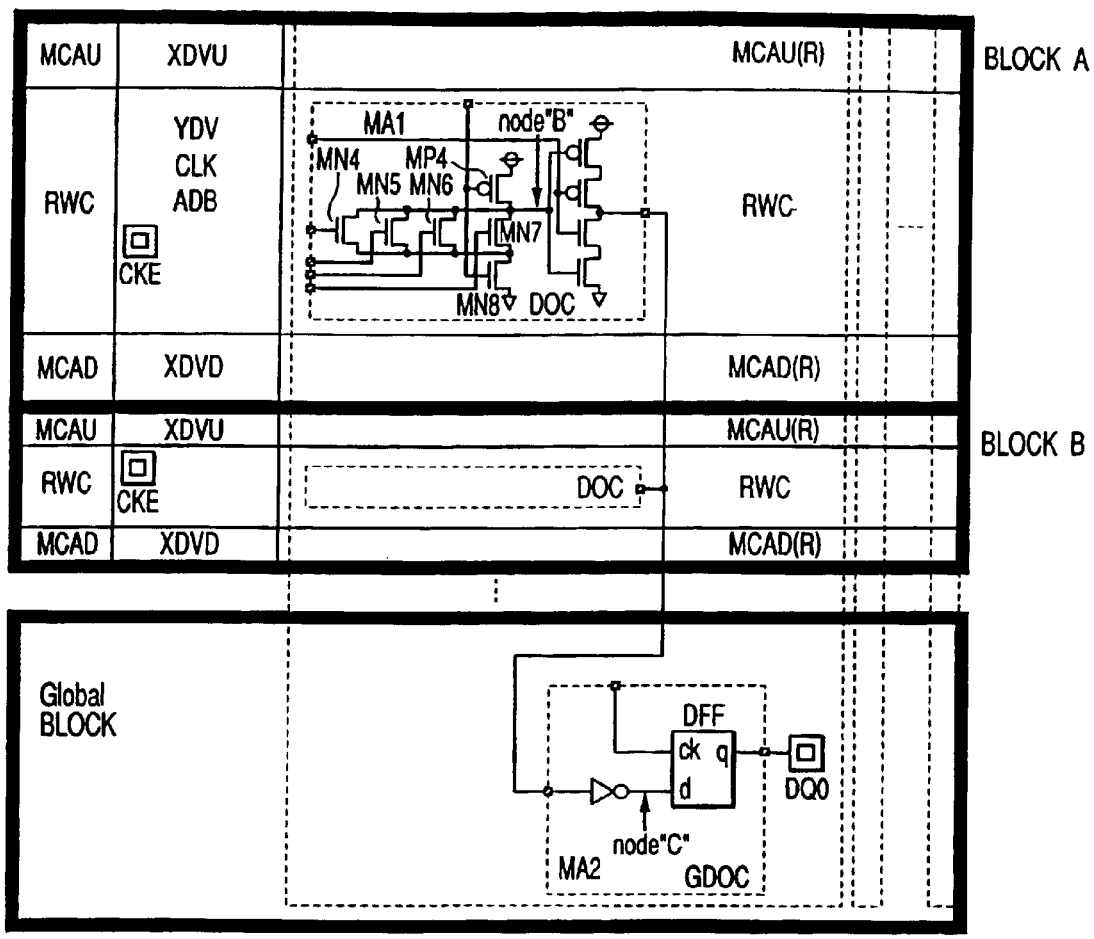
FIG. 13 is a configurational diagram depicting a still further embodiment of a memory circuit according to the present invention.

A configurational diagram showing a still further embodiment of a memory circuit according to the present invention is shown in FIG. 13. The present embodiment is a modification of the embodiment shown in FIG. 12. In a manner similar to the above, a plurality of memory circuits like the above-described memory circuits BLOCKA and BLOCKB are vertically piled in a bit line direction with respect to a global output circuit GDOC provided with a flip-flop circuit DFF for performing data latch.

In the present embodiment, a global bit line is commonly connected to output terminals of first main amplifiers MA1 of the plural vertically-piled memory blocks BLOCKA and BLOCKB or the like. Therefore, output units of the first main amplifiers MA1 of the memory blocks BLOCKA and BLOCKB or the like are respectively provided with triple-state output circuits. Namely, the output of each non-selected memory block is set as output high impedance, and an output signal of the selected memory block is transmitted to the global bit line. In this configuration, a second main amplifier MA2 of a global output circuit GDOC can be made up of a mere inverter circuit.

Figure 14:
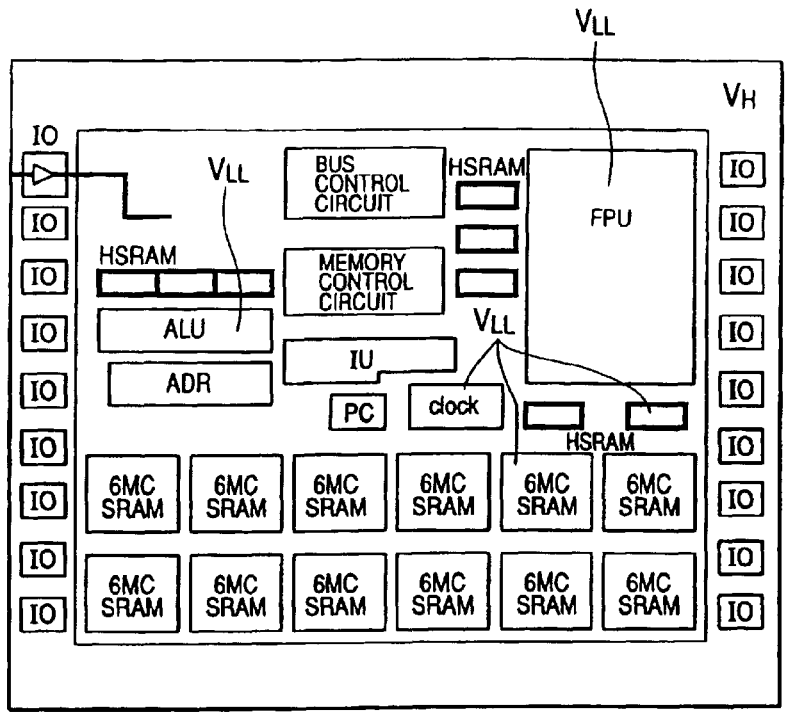
FIG. 14 is an overall configurational diagram showing one embodiment of a semiconductor integrated circuit device according to the present invention.

An overall configurational diagram showing one embodiment of a semiconductor integrated circuit device according to the present invention is shown in FIG. 14. Respective circuit blocks shown in the same drawing are illustrated so as to be aligned with geometrical arrangements on an actual semiconductor chip. The present embodiment comprises various arithmetic units, memory. circuits, a memory control circuit, a bus control circuit, etc.

In order to perform high-speed writing and reading of data in accordance with operating speeds of an arithmetic logic unit ALU and a floating point unit (FPU), the high-speed RAMs according to the aforementioned embodiment are disposed around them. On the other hand, one-port SRAMs provided with memory cells MCs comprising six MOSFETs are disposed below the semiconductor chip. These memory circuits (one-port SRAMS) are used as memory circuits each of which does not require an operating speed so much. While the operating speed is slow as compared with the 2-port SRAMs comprising the eight MOS memory cells, memory capacity can be made great if the same areas are taken. Therefore, the memory circuits are used as data areas for retaining the result of arithmetic operation.

Each of the respective circuit blocks comprises MOSFETs having threshold voltages different according to their functions. For example, each input/output circuit IO, which needs a high withstand voltage or the like, is set to a high threshold voltage $V_H$. An arithmetic logic unit ALU, an FPU, a clock circuit, memory circuits HSRAMs corresponding to two-port SRAMs comprising 8 MOSFETs, and 6MCSRAMs corresponding to one-port SRAMs comprising 6 MOSFETs are respectively set to a low threshold voltage $V_{LL}$. An instruction unit (IU), an address register ADR, a program counter PC, etc. other than them are respectively set to a middle threshold voltage $V_{LH}$. The one-port SRAMs (6MCSRMAs) are larger in memory capacity than the two-port SRAMs (HSRAMs).

Described more specifically, the high-speed memory HSRAM according to the present invention is configured such that as in the embodiment shown in FIG. 1, the two MOSFETMN1 and MOSFETMN2 in the read system are set to the low threshold voltage $V_{LL}$ and others are set to the middle threshold voltage VLH. In each of the SRAMs using the 6 MOS memory cells, a MOSFET for a latch circuit is set to the middle threshold voltage VLH and an address selecting MOSFET is set to the low threshold voltage $V_{LL}$.

Figure 15:
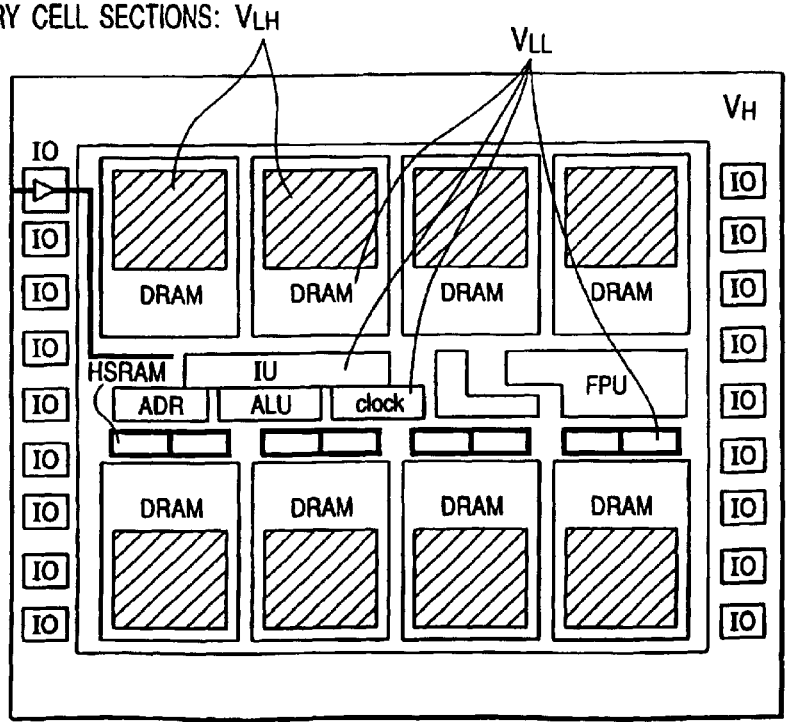
FIG. 15 is an overall configurational diagram illustrating another embodiment of a semiconductor integrated circuit device according to the present invention.

An overall configurational diagram illustrating another embodiment of a semiconductor integrated circuit device according to the present invention is shown in FIG. 15. Respective circuit blocks shown in the same drawing are illustrated so as to match with geometrical arrangements on an actual semiconductor chip. The present embodiment also comprises various arithmetic units, memory circuits, a memory control circuit, a bus control circuit, etc.

In order to perform high-speed writing and reading of data in accordance with operating speeds of an arithmetic logic unit ALU and a floating point unit (FPU), the high-speed RAMs according to the aforementioned embodiment are disposed around them. On the other hand, DRAMs (Dynamic Random Access Memories) using dynamic memory cells are disposed above and below the semiconductor chip. These memory circuits are used as memory circuits each of which does not require an operating speed so much. While the operating speed is slow, memory capacity can be made great if the same areas are taken. Therefore, the memory circuits are used as data areas for retaining the result of arithmetic operation. The memory cells of each DRAM include N channel type MOS transistors.

Each of the respective circuit blocks comprises MOSFETs having threshold voltages different according to their functions. In a manner similar to the above, each input/output circuit IO, which needs a high withstand voltage or the like, is set to a high threshold voltage $V_H$. An arithmetic logic unit ALU, an FPU, a clock circuit and each high-speed RAM are respectively set to a low threshold voltage $V_{LL}$. An instruction unit (IU), a register ADR, and a memory cell unit of each DRAM other than them are respectively set to a middle threshold voltage $V_{LH}$. In each high-speed RAM, however, each MOSFET in the read system is set to the low threshold voltage $V_{LL}$ and others are set to the middle threshold voltage $V_{LH}$ as in the embodiment shown in FIG. 1.

Figure 16:
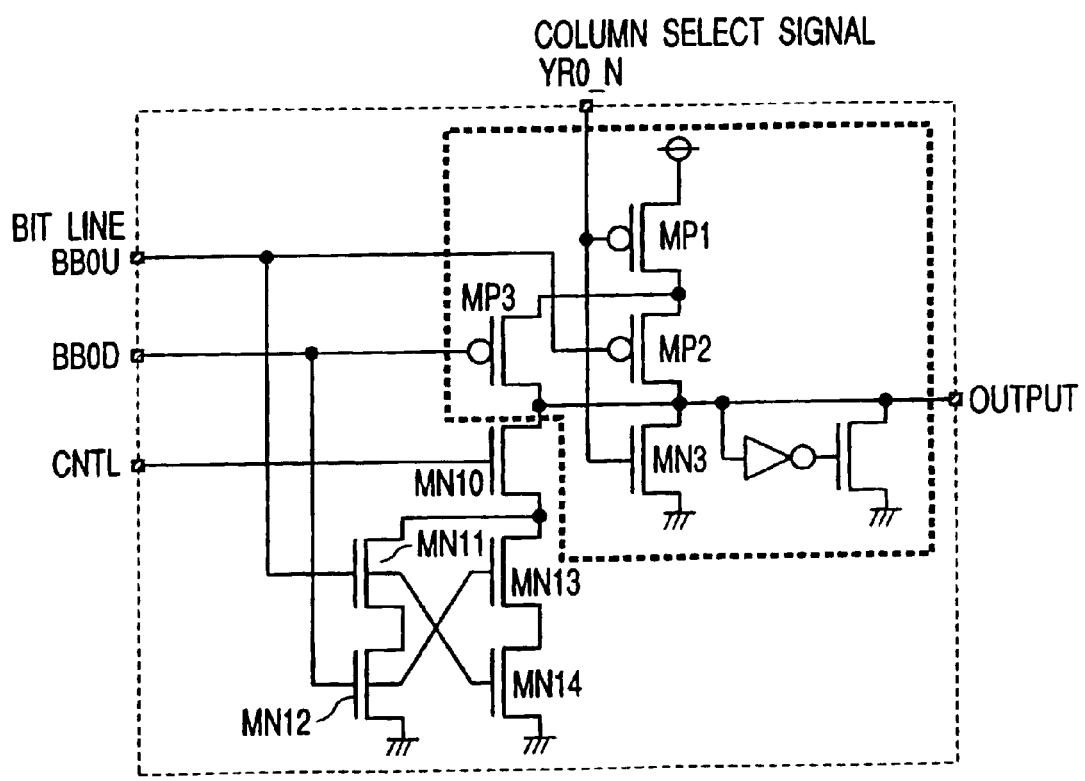
FIG. 16 is a circuit diagram depicting another embodiment of a local amplifier employed in a memory circuit according to the present invention.

A circuit diagram showing another embodiment of a local amplifier employed in a memory circuit according to the present invention is shown in FIG. 16. The local amplifier according to the present embodiment is additionally provided with such a function as to be capable of selecting two amplifying operations of a dynamic operation and a static operation. A circuit surrounded by a dotted line in the same drawing constitutes the dynamic circuit used in FIG. 1 or the like. The following N channel type MOSFETMN10 through MOSFETMN14 are added to such a circuit.

The MOSFETMN11 and MOSFETMN12, and the MOSFETMN13 and MOSFETMN14 are respectively connected in series and connected in a configuration parallel with the MOSFETMN3 through the MOSFETMN10. The gates of these series-connected MOSFETMN11 and MOSFETMN12, and MOSFETMN13 and MOSFETMN14 are respectively supplied with bit lines BB0U and BB0D. Although not restricted in particular, the bit lines BB0U and BB0D are cross-connected to the gates of the MOSFETMN11 and MOSFETMN12 and the MOSFETMN13 and MOSFETMN14.

The MOSFETMN10 has a gate supplied with a control signal CNTL. Since the MOSFETMN10 is brought to an off state when the control signal CNTL is low in level, the dynamic circuit indicated by the dotted line is operated to perform such a dynamic operation as described above. When the static operation is instructed, the signal CNTL goes a high level, so that the MOSFETMN10 is brought to an on state. Thus, the MOSFETMN10 and the MOSFETMN11 and MOSFETMN12 or the MOSFETMN10 and the MOSFETMN13 and MOSFETMN14 are connected in form parallel with the MOSFETMN3.

When the MOSFETMN10 is held on, the bit line BB0D on the lower side remains high in level when, for example, a read signal is obtained at the bit line BB0U on the upper side. Therefore, the MOSFETMN12 and MOSFETMN13 are kept on. Accordingly, the read signal on the bit line BB0U is amplified by the N channel type MOSFETMN11 and MOSFETMN14 with respect to a P channel type MOSFETMP2. Strictly, an output signal corresponding to the ratio between composite conductance of the MOSFETMN11 through MOSFETMN14 and conductance of the MOSFETMP2 is obtained. However, as described above, the P channel type MOSFETMP2 and the N channel type MOSFETMN11 and MOSFETMN14 determines a change in conductance, which occurs in response to a change in input signal.

When the MOSFETMN10 is brought to an off state, the bit line BB0U on the upper side remains high in level when, for example, a read signal is obtained at the bit line BB0D on the lower side. Therefore, the MOSFETMN11 and MOSFETMN14 are kept on. Accordingly, the read signal on the bit line BB0U is amplified by the N channel type MOSFETMN12 and MOSFETMN13 with respect to the P channel type MOSFETMP2. As described above, the two pairs of series circuits MOSFETMN11 and MOSFETMN12, and MOSFETMN13 and MOSFETMN14 are connected in a parallel configuration and supplied with the bit lines BB0U and BB0D on a cross basis. Consequently, the conductances on the N channel type MOSFET side can be equally changed even with respect to the signal from either the bit line BB0U or BB0D, and hence a stable static amplifying operation can be performed.

Figure 17:
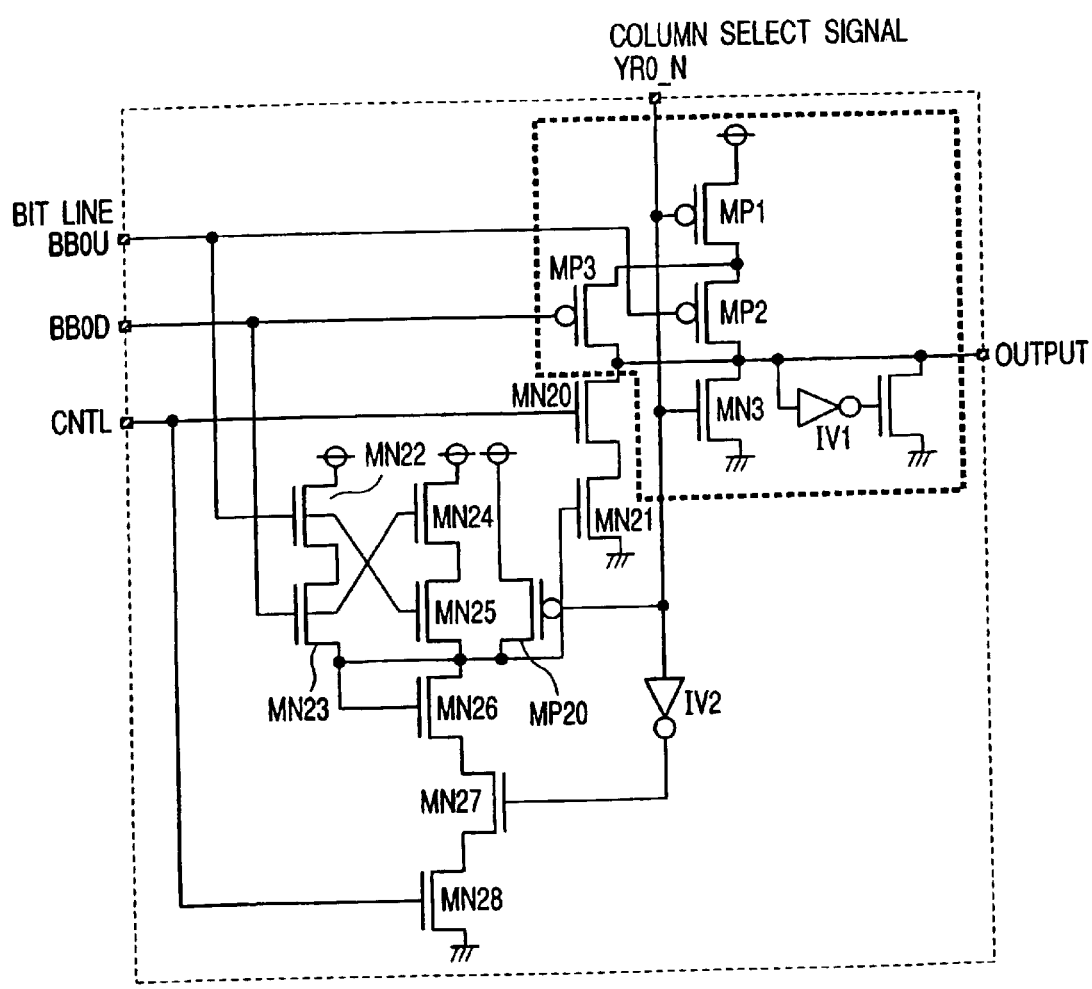
FIG. 17 is a circuit diagram showing a further embodiment of a local amplifier employed in the memory circuit according to the present invention.

A circuit diagram showing a further embodiment of a local amplifier employed in the memory circuit according to the present invention is shown in FIG. 17. The local amplifier according to the present embodiment is additionally provided with such a function as to be capable of selecting two amplifying operations of a dynamic operation and a static operation. A circuit surrounded by a dotted line in the same drawing constitutes the dynamic circuit used in FIG. 1 or the like. The following N channel type MOSFETMN20 through MOSFETMN28 and P channel type MOSFETMP20 are added to such a circuit.

The MOSFETMN20 has a gate supplied with a control signal CNTL. Since the MOSFETMN20 is brought to an off state when the control signal CNTL is low in level, the dynamic circuit indicated by the dotted line is operated to perform such a dynamic operation as described above. When the static operation is instructed, the signal CNTL is taken high in level to bring the MOSFETMN20 to an on state. Thus, the MOSFETMN20 and MOSFETMN21 are connected in form parallel with the MOSFETMN3.

The following circuit is provided such that a similar amplified signal is supplied to the gate of the MOSFETMN21 even when either a bit line BB0U or BB0D is selected. The MOSFETMN22 and MOSFETMN23 and the MoSFETMN24 and MOSFETMN25 are respectively connected in series and respectively have gates to which the bit lines BB0U and BB0D are connected on a cross basis. Thus, the voltages on the bit lines BB0U and BB0D are transmitted to the gate of the N channel type MOSFETMN21 in a source follower form through the MOSFETMN22, 23 and MOSFETMN24 and 25.

A shared source output unit of the MOSFETMN22 and MOSFETMN23, and the MOSFETMN24 and MOS- FETMN25 configured in the source follower form is provided, in series, with the diode-connected N channel type MOSFETMN26 for level shifting, the N channel type MOSFETMN27 operated as a load, and the MOSFETMN28 used as a power switch. The gate of the MOSFETMN28 is supplied with the signal CNTL so that the MOSFETMN28 is turned on upon the static operation.

A column select signal YR0_N is inverted by an inverter circuit IV2, followed by transfer to the gate of the MOSFETMN27. Namely, the MOSFETMN27 of the local amplifier LAMP corresponding to each selected bit line is brought to an on state. Thus, the read signals on the bit lines BB0U and BB0D are transferred to the gate of the N channel type MOSFETMN21 according to a source follower output operation. Consequently, the voltages on the read bit lines BB0U and BB0D are transferred to the P channel type MOSFETMP2 or MOSFETMP3 and the N channel type MOSFETMN21, whereby a static amplifying operation similar to the above is performed.

The P channel type MOSFETMP20 is brought to an on state when the column select signal YR0_N is in a non-selected state, thereby to precharge a source follower output node, i.e., the gate of the N channel type MOSFETMN21 to a power supply voltage identical to a precharge voltage of each of the bit lines BB0U and BB0D. The diode-connected MOSFETMN26 prevents the voltage at the gate of the MOSFETMN21 from being excessively lowered when the gate voltage starts an amplifying operation.

While the invention made above by the present inventors has been described specifically by the illustrated embodiments, the present invention is not limited to the embodiments. It is needless to say that various changes can be made thereto within the scope not departing from the substance thereof. For instance, a memory cell can be applied similarly even to an electrically writable programmable ROM. While the above description has principally been made of the case in which the invention made by the present inventors is applied to an LSI like a microprocessor having built therein a plurality of RAMs, the present invention is not limited to it. The present invention can be widely used in a semiconductor integrated circuit device equipped with a circuit including a circuit for reading a signal outputted from each memory circuit according to a hierarchical system.

Advantageous effects obtained by typical ones of the inventions disclosed in the present application will be described in brief as follows. There is provided first amplifier circuits; which include first MOSFETs of first conductivity type, which have gates provided for a plurality of bit lines to which memory cells are respectively connected, and which are respectively maintained in an off state under precharge voltages supplied to the bit lines, as read circuits of the memory cells determined as to whether memory currents flow according to the operation of selecting word-lines and memory information; and which are respectively brought to operating states in association with select signals for the bit lines, and there is also provided a second amplifier circuit including; a plurality of second MOSFETs of second conductivity type, which have gates respectively supplied with a plurality of amplified signals of the first amplifier circuits and which are connected in parallel configurations; and which forms an amplified signal corresponding to the amplified signals of the first amplifier circuits. Thus, it is possible to reduce a timing margin enabling speeding up and facilitation of timing settings and thereby realize an improvement in access time.

Owing to improvements in circuit delay by the above dynamic circuitry and the adoption of the domino circuit comprising a combination of the N channel type and P channel type MOSFETs, racing avoidance is enabled and a timing margin can be thus reduced. Combining 8-MOSFET (2-port) memories each having the read system circuit with 1-port SRAMs or DRAMs of 6-MOSFETs makes it possible to an easy-to-use semiconductor integrated circuit device equipped with high-speed memories and large-capacity memories.

What is claimed is:

1. A semiconductor device formed on one semiconductor substrate, comprising:

a first word line;

a second word line;

a read bit line;

a first write bit line;

a first memory cell connected to the first and second word lines, the read bit line and the first write bit line;

a third word line;

a first bit line;

a second bit line; and a second memory cell connected to the third word line, the first bit line and the second bit line, wherein the first memory cell includes a first inverter circuit, a second inverter circuit having an input connected to an output of the first inverter circuit and an output connected to an input of the first inverter circuit, a first transistor having a source-drain path one of which is connected to the read bit line, a second transistor having a source-drain path connected to a first terminal, one of which is connected to the other of the source-drain path and the other of which is supplied with a first voltage, and a third transistor having a source-drain path one of which is connected to the input of the first inverter circuit and the other of which is connected to the first write bit line, wherein a gate of the first transistor is connected to the first word line, wherein a gate of the second transistor is connected to the output of the first inverter circuit, wherein a gate of the third transistor is connected to the second word line, and wherein the second memory cell includes a third inverter circuit, a fourth inverter circuit having an input connected to an output of the third inverter circuit and an output connected to an input of the third inverter circuit, a fourth transistor having a source-drain path connected between the first bit line and the output of the third inverter circuit, and a gate connected to the third word line, and a fifth transistor having a source-drain path connected to the second bit line and the input of the third inverter circuit, and a gate connected to the third word line.

2. The semiconductor device according to claim 1, wherein the first voltage is a ground potential.

3. The semiconductor device according to claim 1, wherein each of the first through fourth inverter circuits includes one P type MOS transistor and one N type MOS transistor.

4. The semiconductor device according to claim 1, wherein the first bit line and the second bit line are respectively bit lines commonly used for writing and reading, wherein the first word line is a word line used for read only, wherein the second word line is a word line used for write only, and wherein the third word line is a word line commonly used in writing and reading.

5. The semiconductor device according to claim 1, wherein the first memory cell is a multi-port memory cell, wherein the second memory cell is a one-port memory cell, wherein said semiconductor device includes a plurality of multi-port memory cells and a plurality of one-port memory cells, and wherein the plural one-port memory cells are larger than the plural multi-port memory cells in memory capacity.

6. The semiconductor device according to claim 5, wherein the first memory cell is a two-port memory cell.

7. The semiconductor device according to claim 1, further including a second write bit line, wherein the first memory cell further includes a sixth transistor having a source-drain path one of which is connected to the output of the first inverter circuit and the other of which is connected to the second write bit line, and a gate connected to the second word line.

8. A semiconductor device formed on one semiconductor substrate, comprising:

a first word line;

a second word line;

a read bit line;

a first write bit line;

a first memory cell connected to the first and second word lines, the read bit line and the first write bit line;

a third word line;

a first bit line;

a second bit line; and a second memory cell connected to the third word line, and the first bit line and the second bit line, wherein the first memory cell includes:

a latch circuit including a first inverter circuit, and a second inverter circuit having an input connected to an output of the first inverter circuit and an output connected to an input of the first inverter circuit;

a first and a second transistors whose source-drain paths are series-connected between the read bit line and a first terminal supplied with a first voltage; and a third transistor having a source-drain path connected between the latch circuit and the first write bit line and a gate connected to the second word line, wherein a gate of the first transistor is connected to the first word line, wherein a gate of the second transistor is connected to the latch circuit, and wherein the second memory cell includes a third inverter circuit, a fourth inverter circuit having an input connected to an output of the third inverter circuit, and an output connected to an input of the third inverter circuit, a fourth transistor having a source-drain path connected to the first bit line and the output of the third inverter circuit, and a gate connected to the third word line, and a fifth transistor having a source-drain path connected to the second bit line and the input of the third inverter circuit, and a gate connected to the third word line.

9. The semiconductor device according to claim 8, wherein one of the source-drain path of the first transistor is connected to the read bit line, and the source-drain path of the second transistor is connected between the other of the source-drain path of the first transistor and the first terminal, wherein the gate of the second transistor is connected to the output of the first inverter circuit, and wherein the source-drain path of the third transistor is connected between the input of the first inverter circuit and the first write bit line.

10. The semiconductor device according to claim 8, wherein one of the source-drain path of the first transistor is connected to the read bit line, wherein the source-drain path of the second transistor is connected between the other of the source-drain path of the first transistor and the first terminal, wherein the gate of the second transistor is connected to the output of the first inverter circuit, and wherein the source-drain path of the third transistor is connected between the output of the first inverter circuit and the first write bit line.

11. The semiconductor device according to claim 8, wherein the first voltage is a ground potential.

12. The semiconductor device according to claim 8, wherein each of the first through fourth inverter circuits includes one P type MOS transistor and one N type MOS transistor.

13. The semiconductor device according to claim 8, wherein the first bit line and the second bit line are respectively bit lines commonly used for writing and reading, wherein the first word line is a word line used for read only, wherein the second word line is a word line used for write only, and wherein the third word line is a word line commonly used in writing and reading.

14. The semiconductor device according to claims 8, wherein the first memory cell is a multi-port memory cell, wherein the second memory cell is a one-port memory cell, wherein said semiconductor device includes a plurality of multi-port memory cells and a plurality of one-port memory cells, and wherein the plural one-port memory cells are larger than the plural multi-port memory cells in memory capacity.

15. The semiconductor device according to claim 14, wherein the first memory cell is a two-port memory cell.

16. The semiconductor device according to claim 8, further including a second write bit line, wherein the first memory cell further includes a sixth transistor having a source-drain path connected between the output of the first inverter circuit and the second write bit line, and a gate connected to the second word line, wherein one of the source-drain path of the first transistor is connected to the read bit line, wherein the source-drain path of the second transistor is connected between the other of the source-drain path of the first transistor and the first terminal, wherein the gate of the second transistor is connected to the output of the first inverter circuit, and wherein the source-drain path of the third transistor is connected between the input of the first inverter circuit and the first write bit line.

17. A semiconductor device formed on one semiconductor substrate, comprising:
a first word line;
a second word line;
a read bit line;
a first write bit line;
a first memory cell connected to the first and second word lines, the read bit line and the first write bit line;
a third word line;
a first bit line; and
a second memory cell connected to the third word line and the first bit line,
wherein the first memory cell includes:
a latch circuit including a first inverter circuit, and a second inverter circuit having an input connected to an output of the first inverter circuit and an output connected to an input of the first inverter circuit;
a first and a second transistors whose source-drain paths are series-connected between the read bit line and a first terminal supplied with a first voltage; and
a third transistor having a source-drain path connected between the latch circuit and the first write bit line and a gate connected to the second word line,
wherein a gate of the first transistor is connected to the first word line,
wherein a gate of the second transistor is connected to the latch circuit, and
wherein the second memory cell includes a fourth transistor having a gate connected to the third word line and a source-drain path whose one is connected to the first bit line, and a capacitor having a pair of electrodes one of which is connected to the other of the source-drain path of the fourth transistor and the other of which is supplied with a second voltage.

18. The semiconductor device according to claim 17,
wherein one of the source-drain path of the first transistor is connected to the read bit line,
wherein the source-drain path of the second transistor is connected between the other of the source-drain path of the first transistor and the first terminal,
wherein the gate of the second transistor is connected to the output of the first inverter circuit, and
wherein the source-drain path of the third transistor is connected between the input of the first inverter circuit and the first write bit line.

19. The semiconductor device according to claim 17,
wherein one of the source-drain path of the first transistor is connected to the read bit line,
wherein the source-drain path of the second transistor is connected between the other of the source-drain path of the first transistor and the first terminal,
wherein the gate of the second transistor is connected to the output of the first inverter circuit, and
wherein the source-drain path of the third transistor is connected between the output of the first inverter circuit and the first write bit line.

20. The semiconductor device according to claim 17,
wherein the first voltage is a ground potential, and
wherein the second voltage is a plate potential larger than the ground potential.

21. The semiconductor device according to claim 17, wherein each of the first through fourth inverter circuits includes one P type MOS transistor and one N type MOS transistor.

22. The semiconductor device according to claim 17,
wherein the first bit line and the second bit line are respectively bit lines commonly used for writing and reading,
wherein the first word line is a word line used for read only,
wherein the second word line is a word line used for write only, and
wherein the third word line is a word line commonly used in writing and reading.

23. The semiconductor device according to claim 17,
wherein the first memory cell is a multi-port memory cell,
wherein the second memory cell is a one-port memory cell,
wherein said semiconductor device includes a plurality of multi-port memory cells and a plurality of one-port memory cells, and
wherein the plural one-port memory cells are larger than the plural multi-port memory cells in memory capacity.

24. The semiconductor device according to claim 23, wherein the first memory cell is a two-port memory cell.

25. The semiconductor device according to claim 17, further including a second write bit line,
wherein the first memory further includes a fifth transistor having a source-drain path one of which is connected to the output of the inverter circuit and the other of which is connected to the second write bit line, and a gate connected to the second word line,
wherein the input of the first inverter circuit is connected to the output of the second inverter circuit,
wherein the output of the first inverter circuit is connected to the input of the first inverter circuit,
wherein one of the source-drain path of the first transistor is connected to the read bit line,
wherein the source-drain path of the second transistor is connected between the source-drain path of the first transistor and the first terminal,
wherein the gate of the second transistor is connected to the output of the first inverter circuit, and
wherein the source-drain path of the third transistor is connected between the output of the second inverter circuit and the first write bit line.

26. The semiconductor device according to claim 17, wherein the first through fourth transistors are respectively N channel type MOS transistors.

* * * * *